US007999580B2

(12) United States Patent
Tashiro

(10) Patent No.: US 7,999,580 B2
(45) Date of Patent: Aug. 16, 2011

(54) BAND CONVERTED SIGNAL GENERATOR AND BAND EXTENDER

(75) Inventor: Atsushi Tashiro, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 356 days.

(21) Appl. No.: 12/086,484

(22) PCT Filed: Oct. 31, 2006

(86) PCT No.: PCT/JP2006/321692

§ 371 (c)(1),
(2), (4) Date: Jun. 13, 2008

(87) PCT Pub. No.: WO2007/069400

PCT Pub. Date: Jun. 21, 2007

(65) Prior Publication Data

US 2009/0278573 A1 Nov. 12, 2009

(30) Foreign Application Priority Data

Dec. 16, 2005 (JP) ................................ 2005-363065

(51) Int. Cl.
*H03B 19/00* (2006.01)

(52) U.S. Cl. ......... 327/113; 327/114; 327/115; 327/117

(58) Field of Classification Search .................. 327/113, 327/115, 117

See application file for complete search history.

(56) References Cited

U.S. PATENT DOCUMENTS

2003/0118176 A1 6/2003 Tokuda et al.

FOREIGN PATENT DOCUMENTS

| | | |
|---|---|---|
| CN | 1535459 A | 10/2004 |
| JP | 09-258787 | 10/1997 |
| JP | 2000-250571 | 9/2000 |
| JP | 2003-256000 | 9/2003 |
| JP | 2005-173476 | 6/2005 |
| WO | WO-2004/077408 A1 | 9/2004 |

OTHER PUBLICATIONS

Yuki Yoshida et al., "Codebook Mapping ni yoru Kyotaiiki Onsei kara Kotaiiki Onsei no Fukugenho" IEICE Technical Report, Aug. 1993, SP93-61, pp. 31-38.

*Primary Examiner* — Lincoln Donovan
*Assistant Examiner* — John W Poos
(74) *Attorney, Agent, or Firm* — Rabin & Berdo, PC

(57) ABSTRACT

A band converted signal generator includes a low range characteristic application section (16) as a component emphasis means emphasizing only one or more specific frequency components selected from among frequency components of an input signal; and a low pass filter (17) as a component extraction means extracting a signal component of a desired frequency band from an output signal supplied from the low range characteristic application section (16). A band extender (1000) includes the above-mentioned band converted signal generator, and an adder (15) adding the input signal, a certain frequency band of which is suppressed, and a signal including at least one component generated within the certain frequency band which is suppressed.

12 Claims, 22 Drawing Sheets

BAND CONVERTED SIGNAL GENERATOR AND BAND EXTENDER

FIELD OF THE INVENTION

The present invention relates to a band converted signal generator and a band extender, and is capable of being applied to, for example, an apparatus for converting a voice signal transmitted from a narrow-band telephone or telephone exchange to a wide-band signal.

BACKGROUND OF THE INVENTION

In recent years, voice communications using various kinds of networks become very popular, but telephonic voice communications generally use the limited frequency band, i.e., the so-called telephone band that has a frequency range from 300 Hz to 3.4 kHz according to the practice of the time when the conventional general public networks were being used. However, a human voice also includes a frequency component below 300 Hz and another frequency component above 3.4 kHz, which are important components relating to individuality of utterance, and a lack of these components leads to not only the loss of individuality but also the degraded voice quality. Therefore, it is desirable that the telephonic voice communication be carried out using a voice including these components.

However, there is a problem that a telephone exchange in the public switched telephone network cannot transmit the voice components outside the telephone band. Furthermore, there is another problem that a sending-side terminal in a network other than the public switched telephone network is designed according to the conventional practice not so as to be able to transmit the voice components outside the telephone band. There are proposals for some technologies relating to such problems, which are disclosed in, for example, Patent Document 1.

The technologies disclosed in Patent Document 1 will be described with reference to FIG. 2. Referring to FIG. 2, first, a narrow-band signal DC, a frequency of which is limited to a range from 300 Hz to 3.4 kHz, is input to the band extender 10.

In the band extender 10, the narrow-band signal DC is input to the sampling frequency converter 11 to be converted to a converted original signal S, a sampling frequency of which has been changed. The converted original signal S is then supplied to the high range signal generator 13, the voiceless portion signal generator 14, and the low range signal generator 12 respectively.

The low range signal generator 12 generates an extended signal (hereinafter referred to as a "synthesized low range signal") LS including components extended to a lower frequency side (below 300 Hz) from the converted original signal S. The high range signal generator 13 generates another extended signal (hereinafter referred to as a "synthesized high range signal") HS including components extended to a higher frequency side (from 3.4 to 7 kHz) from the converted original signal S. The voiceless portion signal generator 14 generates another extended signal (hereinafter referred to as a "synthesized voiceless signal") US including an extended voiceless portion (a high range voiceless portion in the case of Patent Document 1) from the converted original signal S. Furthermore, the adder 15 adds the synthesized low range signal LS, the synthesized high range signal HS, and the synthesized voiceless signal US to the converted original signal S, thereby generating a band extended signal V.

Since the band extended signal V is generated by supplying both the low range signal and the high range signal generated from the band limited narrow-band signal DC in addition to the transmitted signal, a user can hear a voice of the band extended signal V that makes him/her feel as if he/she heard a voice of the wide-band signal including these components.

The generation of the synthesized low range signal LS is carried out by generating a fundamental period waveform having a period based on a fundamental frequency of the extended low range from an autocorrelation function. Further, the generation of the synthesized high range signal HS is carried out by generating an arbitrary sound source waveform on the basis of a result of the estimation of a fundamental frequency and an amplitude and extracting only the high range components therefrom. Furthermore, in Patent Document 1, the fundamental period waveform and the amplitude are obtained from the low range signal generator 12, but they may be estimated in the high range signal generator 13 separately. Moreover, the generation of the synthesized voiceless portion signal US is carried out by extracting a high frequency component of an aliasing (folding noise) in a half-wave rectification and extracting a high range component not having a harmonic structure.

Patent Document 1 is Japanese Patent Application Kokai (Laid Open) Publication No. 9-258787.

DISCLOSURE OF THE INVENTION

Problems to be Solved by the Invention

However, in the conventional art disclosed in Patent Document 1, since the application of the artificial waveform leads to disparities in a harmonic structure and a waveform phase between a signal before the band extension and a band extended signal, there is a problem that sufficient sense of realism cannot be obtained and satisfactory performance for producing a sound signal similar to the original wide-band signal cannot be obtained.

Therefore, there is a need of a band converted signal generator and a band extender that can produce a band extended wide-band signal that resembles the original signal.

Means for Solving the Problem

In order to solve such problems, a band converted signal generator of the present invention converts a signal, a certain frequency band of which is suppressed, to another signal having a component of the certain frequency band which is suppressed, and includes a component emphasis means emphasizing only one or more specific frequency components selected from among frequency components of an input signal, and a component extraction means extracting a signal component of a desired frequency band from an output signal supplied from the component emphasis means.

The band extender of the present invention includes the above-mentioned band converted signal generator converting a signal, a certain frequency band of which is suppressed, to another signal having a component of the certain frequency band which is suppressed, and an adder adding the signal, the certain frequency band of which is suppressed, as an input signal, and a signal including at least one component generated within the certain frequency band which is suppressed.

Effects of the Invention

According to the band converted signal generator and the band extender of the present invention, a signal similar to the original signal can be generated by emphasizing a signal component of a certain frequency band which is suppressed.

EXPLANATION OF REFERENCE NUMERALS

1000, 2000, 3000, 4000, 5000, 6000, 7000, 8000, 9000, 10000, 11000, 12000, 12200, 13000 band extender;
16, 22, 72, 82 low range characteristic application section;
17 low pass filter;
32, 42, 52, 62, 92, 102, 112, 122, 132, 142 characteristic emphasis application section;
11 sampling frequency converter;
13 high range signal generator;
14 voiceless portion signal generator;
15, 31 adder;
70 presence/absence-of-sound determination section;
23 characteristic emphasis application section;
24, 88 signal component determination section;
25 component extractor;
26 switch;
27 characteristic non-application section;
43, 53 band amplifier;
44, 54, 94 component strength estimator;
45, 55 amplification shape storage section;
46 output storage section;
56, 66, 106, 116, 126 frequency estimator;
65, 125, 145 amplification shape generator.

BEST MODE FOR CARRYING OUT THE INVENTION

《A》 First Embodiment

A band converted signal generator and a band extender according to the first embodiment of the present invention will be described below with reference to the drawings.

Although in the first embodiment it is assumed that a unit of an audio frame (a frame) consists of data for a specific period of time (10 ms in the first embodiment) and processing is performed on an audio frame-by-frame basis, a time length of the frame is not limited to this specific period of time. Further, the processing is not limited to the processing for each frame having a fixed length, but it may be the processing for each sample even if the frame has a variable length.

<A-1> Structure in First Embodiment

Figure 1:
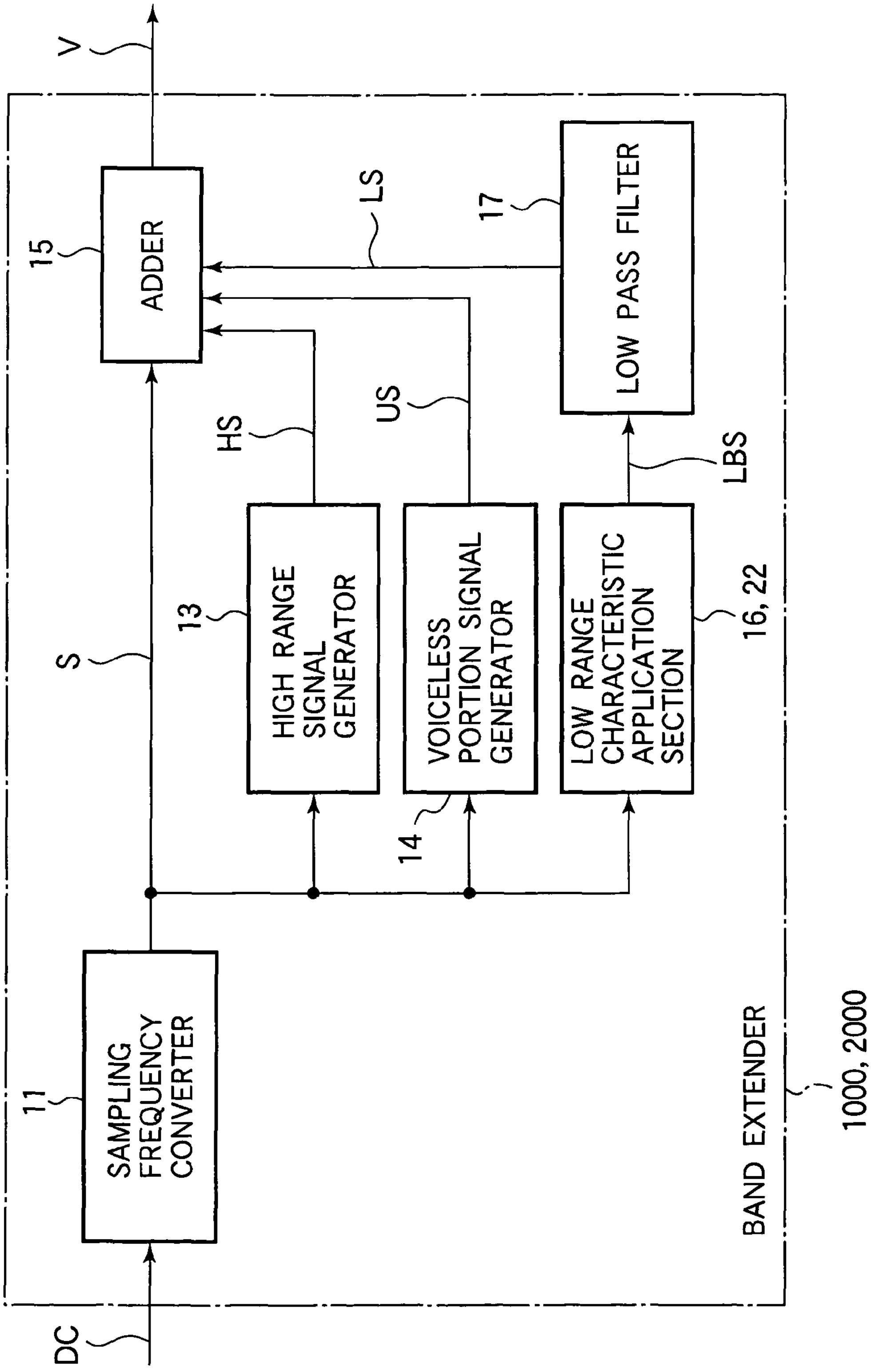
FIG. 1 is a functional block diagram showing an internal structure of a band extender according to the first and second embodiments.

FIG. 1 is a functional block diagram showing a structure of a band extender 1000 according to the first embodiment. Constitutional elements in FIG. 1 that are the same as or correspond to those shown in the above-described FIG. 2 are assigned the same reference numerals or characters.

Referring to FIG. 1, the band extender 1000 of the first embodiment includes a sampling frequency converter 11, a high range signal generator 13, a voiceless portion signal generator 14, an adder 15, a low range characteristic application section 16, and a low pass filter 17.

The sampling frequency converter 11, the high range signal generator 13, the voiceless portion signal generator 14, and the adder 15 can be implemented by using devices described in Patent Document 1. However, a method of generating a synthesized high range signal HS and a synthesized voiceless signal US, for use of generating a band extended signal V, is not limited to a method described in Patent Document 1, and other already-existing methods may be used.

Figure 2:
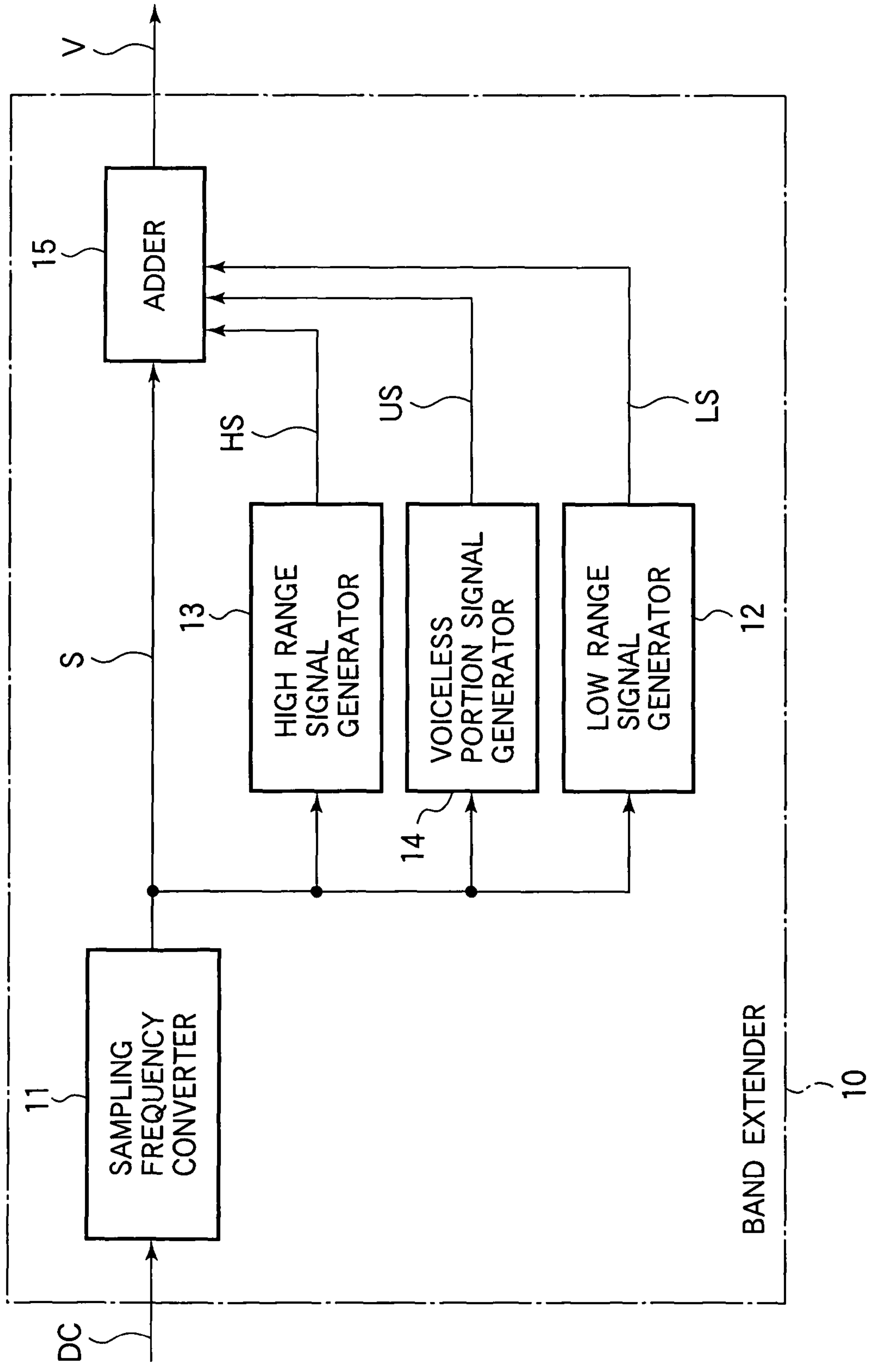
FIG. 2 is a functional block diagram showing an internal structure of the conventional band extender.

The band extender 1000 of the first embodiment has a feature in a method of generating a synthesized low range signal LS, and is different from that having the conventional structure of FIG. 2 in a point that it includes a low range characteristic application section 16 and a low pass filter 17.

Further, although a description will be made as to a case where the band extender 1000 of the first embodiment includes both the high range signal generator 13 and the voiceless portion signal generator 14, the band extender 1000 may include either the high range signal generator 13 or the voiceless portion signal generator 14, or may include neither the high range signal generator 13 nor the voiceless portion signal generator 14. Furthermore, in the first embodiment, a description will be made as to a case where the high range signal generator 13 and the voiceless portion signal generator 14 generate the synthesized high range signal and the synthesized voiceless signal independently and respectively.

Referring to FIG. 1, the low range characteristic application section 16 receives a converted original signal S, a sampling frequency of which has been converted by the sampling frequency converter 11, and outputs a low range characteristic application signal LBS to the low pass filter 17. The low range characteristic application section 16 includes a characteristic emphasis application section, which is not shown in FIG. 1, in its inside, and the input/output signals and processing of the characteristic emphasis application section are the same as the input/output signals and processing of the low range characteristic application section 16.

The low pass filter 17 receives a low range characteristic application signal LBS from the low range characteristic application section 16 and outputs a synthesized low range signal LS to the adder 15.

<A-2> Operation in First Embodiment

Next, a description will be made as to operation of the band extender 1000 of the first embodiment. In the first embodiment, the following operation is performed every time one audio frame is input to the band extender 1000.

When a narrow-band signal (a digital signal) DC is input to the band extender 1000, the narrow-band signal DC is converted to the converted original signal S by the sampling frequency converter 11, in which a sampling frequency of the converted original signal S is increased (e.g., from 8 kHz to 16 kHz). The converted original signal S is then supplied to the adder 15, the high range signal generator 13, the voiceless portion signal generator 14, and the low range characteristic application section 16. In the first embodiment, a description is made as to a case where the sampling frequency is converted from 8 kHz to 16 kHz, but the sampling frequencies are not limited to these values and may be set to other values in accordance with a sampling frequency of a voice actually used.

As has been described above, the low range characteristic application section 16 receives the converted original signal S on an audio frame-by-frame basis, the received converted original signal S is caused to pass through an amplifier circuit for amplifying an arbitrary frequency component of the converted original signal S, and a result of the amplifying is output as the low range characteristic application signal LBS to the low pass filter 17.

In the narrow-band signal DC, component(s) of frequency band(s) outside a limited frequency band are not cut off completely, and as a matter of fact, there often remains a little amount of the components of the frequency bands outside the limited frequency band. Therefore, the converted original signal S, a sampling frequency of which has been converted, also includes a little amount of the components of these frequency bands. For this reason, in the first embodiment, the low range characteristic application section 16 emphasizes this frequency component, thereby enhancing the low range frequency component to output the enhanced component. In this way, a voice signal having a lot of sense of realism can be produced. Further, the amplifier circuit provided in the low range characteristic application section 16 may be an amplifier circuit for amplifying a frequency component of a predetermined frequency (180 Hz in the first embodiment) by a specific amplification amount, for example, an amplifier circuit for amplifying a component of a frequency range between 180 Hz and 220 Hz by 6 dB.

Instead of the amplifier circuit, other functional means are widely applicable as long as they can amplify a frequency component of the specific frequency by the specific amplification amount. Further, the frequency of the component to be amplified by the amplifier circuit and the amplification amount are not limited to the above-mentioned values and they may be set arbitrarily. Furthermore, the frequency component to be amplified by the amplifier circuit is not limited to a single frequency component, but the amplifier circuit may be constructed so as to amplify a plurality of frequency components. Moreover, in the below-described embodiments, a case where a single frequency component is amplified will be described unless otherwise described.

When receiving the low range characteristic application signal LBS, the low pass filter 17 extracts a low range frequency component, a frequency of which is lower than a frequency of the telephone band, and supplies the extracted low band component as a synthesized low range signal LS to the adder 15.

Further, in the first embodiment, a description is made as to a case where the low range characteristic application section 16 and the low pass filter 17 are provided separately. However, if a single functional means can include a filter that can implement both a function of amplifying the low range frequency component and a function of extracting the low range frequency component, the single functional means is applicable instead of the low range characteristic application section 16 and the low pass filter 17.

The high range signal generator 13 receives the converted original signal S from the sampling frequency converter 11, generates a signal having a frequency component of a higher frequency than the band limited frequency, and outputs the synthesized high range signal HS to the adder 15. Further, a method of generating the synthesized high range signal HS in the high range signal generator 13 may be a method known as already-existing technology, and therefore its detail will not be described.

The voiceless portion signal generator 14 receives the converted original signal S from the sampling frequency converter 11, and outputs the synthesized voiceless portion signal US to the adder 15. Further, a method of generating the synthesized voiceless portion signal US in the voiceless portion signal generator 14 may be a method known as already-existing technology, and therefore its detail will not be described.

The adder 15 receives the synthesized low range signal LS, the synthesized high range signal HS, the synthesized voiceless portion signal US, and the converted original signal S, and adds these signals to output a result of the adding as a band extended signal V.

Further, the adder 15 may use weighting coefficients in the step of adding the four kinds of signals. Furthermore, if delays take place in the step of generating each kind of signals, the adder 15 can add each kind of signals at the timing in consideration of the delays. The weighting coefficients can be set arbitrarily by the designer so as to improve the quality of the output voice.

<A-3> Effects in First Embodiment

As has been described above, in the first embodiment, instead of adding the synthesized signal component to a band of the low range, the components of a band of the low range are emphasized. Therefore, it is possible to reduce an unnatural feeling due to mismatching of a fundamental period as compared with the conventional method having a step of applying a fundamental period waveform.

Furthermore, in the first embodiment, it is possible to eliminate a feeling of insufficiency of the components of the band of the low range, which was perceived when a specific frequency component was added. As a matter of course, it is possible to cause the user to hear the sound having a spacious feeling of the sound of the entire low range. As a result of this, the sound quality of the output voice signal can be improved.

《B》 Second Embodiment

Next, a band converted signal generator and a band extender according to the second embodiment of the present invention will be described with reference to FIG. 1 and FIG. 3.

<B-1> Structure in Second Embodiment

The second embodiment is different from the first embodiment in a point of a structure of the low range characteristic application section, but the second embodiment is the same as or corresponds to the first embodiment in a point of other structures. Therefore, the second embodiment will be described with reference to FIG. 1. Further, in the description of the second embodiment, a band extender is indicated by a reference numeral 2000 in FIG. 1 and a low range characteristic application section is indicated by a reference numeral 22 in FIG. 1. Furthermore, in the description of the second embodiment, the function and structure of the low range characteristic application section 22 will be described in detail, and the detailed description of the other structures are omitted by assigning these structures the same reference numerals or characters as those in FIG. 1.

Figure 3:
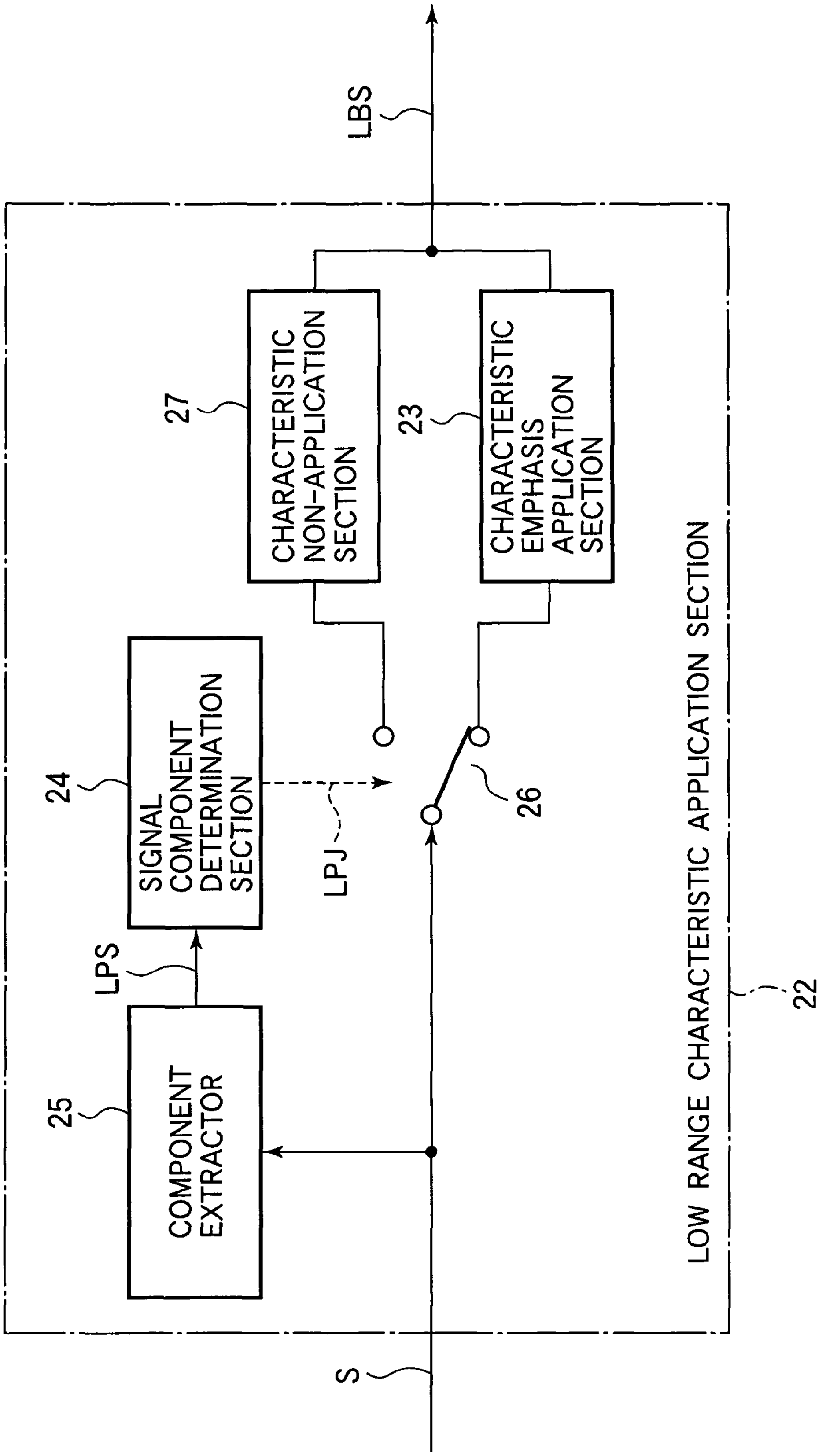
FIG. 3 is a functional block diagram showing an internal structure of a low range characteristic application section in the second embodiment.

FIG. 3 is a functional block diagram showing an internal structure of a low range characteristic application section 22 in the second embodiment. The band extender 2000 of the second embodiment performs the respective functions every time one audio frame is input to it, in a similar manner to the first embodiment.

Referring to FIG. 3, the low range characteristic application section 22 of the second embodiment includes a component extractor 25, a signal component determination section 24, a switch 26, a characteristic non-application section 27, and a characteristic application emphasis section 23.

The component extractor 25 receives the converted original signal S, and outputs a component extraction signal LPS to the signal component determination section 24.

The signal component determination section 24 receives the component extraction signal LPS from the component extractor 25, and outputs low range determination information LPJ to the switch 26.

The switch 26 receives the converted original signal S and the low range determination information LPJ, and switches its connection to the characteristic emphasis application section 23 or the characteristic non-application section 27 on the basis of the received low range determination information LPJ, thereby outputting the converted original signal S.

The characteristic emphasis application section 23 receives the converted original signal S through the switch 26, and outputs a low range characteristic application signal LBS obtained by applying the low range characteristic component described below to the low pass filter 17.

The characteristic non-application section 27 receives the converted original signal S through the switch 26, and outputs a low range characteristic application signal LBS obtained by not applying the low range characteristic component described below to the low pass filter 17.

<B-2> Operation in Second Embodiment

Next, a description will be made as to operation of the low range characteristic application section 22 of the band extender 2000 of the second embodiment.

When receiving the converted original signal S, the component extractor 25 extracts a frequency component to be used in the signal component determination section 24, and outputs a result of the extracting as the component extraction signal LPS to the signal component determination section 24.

It is conceivable that a method of extracting the frequency component by the band pass filter that allows a predetermined frequency band (e.g., 300 Hz) is adopted as a method of extracting the frequency component in the second embodiment, for example. The frequency of the extracted component or the filter can be changed on the basis of the determination of the component in the signal component determination section 24. For example, the band pass filter or the like, a pass band of which is a range from 50 Hz to 300 Hz, can be adopted. Furthermore, a frequency range of the pass band is not limited to this range.

Further, in the second embodiment, a description is made as to a case where the component extraction signal LPS is a signal generated by the above-mentioned band pass filter. However, the component extraction signal LPS may be information having a signal level obtained on the basis of this generated signal. Further, it is not limited to such information, and it may be other information that can be determined by the below-mentioned signal component determination section 24.

When receiving the extracted component extraction signal LPS extracted by the component extractor 25, the signal component determination section 24 determines whether the component extraction signal LPS includes a sufficient component for applying the low range characteristic by the low range characteristic application section 23, and supplies a result of the determining as the low range determination information LPJ to the switch 26.

A method of determining in the signal component determination section 24 may be, for example, a method of determining on the basis of a signal level of the input component extraction signal, in which the component extraction signal LPS is determined to have a sufficient characteristic when a signal level of the component extraction signal LPS is higher than a threshold −40 dBm0 and the component extraction signal LPS is determined not to have a sufficient characteristic when a signal level of the component extraction signal LPS is not higher than a threshold −40 dBm0.

However, the threshold in the voice signal level is not limited to this value, and it may be set statically or dynamically. Furthermore, the method of determining is not limited to the method of determining on the basis of the signal level of the entire component extraction signal LPS, and it may be a method of determining on the basis of the strength of the frequency component in a part of the component extraction signal LPS. For example, the method of determining may be a method of determining on the basis of a result of comparison between the strength of the frequency component at 200 Hz in the component extraction signal LPS and the predetermined threshold or another method, but the above-mentioned frequency is not limited to this value.

The switch 26 receives the low range determination information LPJ from the signal component determination section 24, determines whether the input converted original signal S is supplied to the low range characteristic application section 23 or the characteristic non-application section 27 on the basis of the low range determination information LPJ, and then switches its connection to a terminal, to which the signal is to be output.

In the second embodiment, if the low range determination information LPJ indicates the presence of the sufficient characteristic component, the switch switches it connection to the low range characteristic application section 23, and if otherwise, the switch switches it connection to the characteristic non-application section 27.

If the function of the switch 26 is not impaired, other functional means may execute the function of the switch 26.

When receiving the converted original signal S, the characteristic emphasis application section 23 amplifies the arbitrary frequency component of the converted original signal S and outputs a result of the amplifying as the low range characteristic application signal LBS. The method of amplifying the arbitrary frequency component is implemented by, for example, an amplification filter that can amplify the predetermined frequency component. The characteristic emphasis application section 23 may be the same as the low range characteristic application section 16 in the first embodiment.

When receiving the converted original signal S, the characteristic non-application section 27 replace the input data with a value of zero to output it as the low range characteristic application signal LBS. The processing in the characteristic non-application section 27 is carried out when an advantage of the band extension cannot be expected even if the band emphasis is executed or in order to avoid a state where an unusual sound or noise is noticeable. Further, the characteristic non-application section 27 may change its output signal in accordance with operation of the adder 15 disposed at the downstream stage. For example, the characteristic non-application section 27 may output a background noise signal or the like stored in advance as its output signal. Furthermore, if the weighting coefficients, by which each component of the synthesized signal is multiplied when the adder 15 adds each component of the synthesized signal, can be changed in accordance with operation of the low range characteristic application section 22, the characteristic non-application section 27 can be omitted so as to output the converted original signal S as it is or not so as to output the converted original signal S. Moreover, the functions of the characteristic non-application section 27 and the switch 26 may be executed in the adder 15.

Although in the first embodiment, the remaining component is emphasized because there is a weak remaining component outside a defined band of the band limited signal S (a frequency component is not cut off completely outside the defined band), there is high probability that a part corresponding to a part other than presence-of-sound includes a component that does not need to be emphasized, for example. Accordingly, in the second embodiment, when it is determined that the sufficient advantage cannot be obtained in the first embodiment, the voiceless signal is generated not so as to output an unusual sound signal in the low range frequency component.

<B-3> Effects in Second Embodiment

As has been described above, in the second embodiment, the component emphasis is executed by the low pass filter, the signal component determination section and the switch only when the component emphasis has an advantage, and therefore it is possible to suppress an unusual sound generated by emphasizing the component that does not need to be emphasized. In this embodiment, in terms of a result of the output, the function of adding the low band component is not impaired similarly, and this embodiment has the same advantage as that of the first embodiment. As a result of this, the sound quality of the output signal can be further improved.

《C》 Third Embodiment

Next, a band converted signal generator and a band extender according to the third embodiment of the present invention will be described with reference to the drawings.

<C-1> Structure in Third Embodiment

Figure 4:
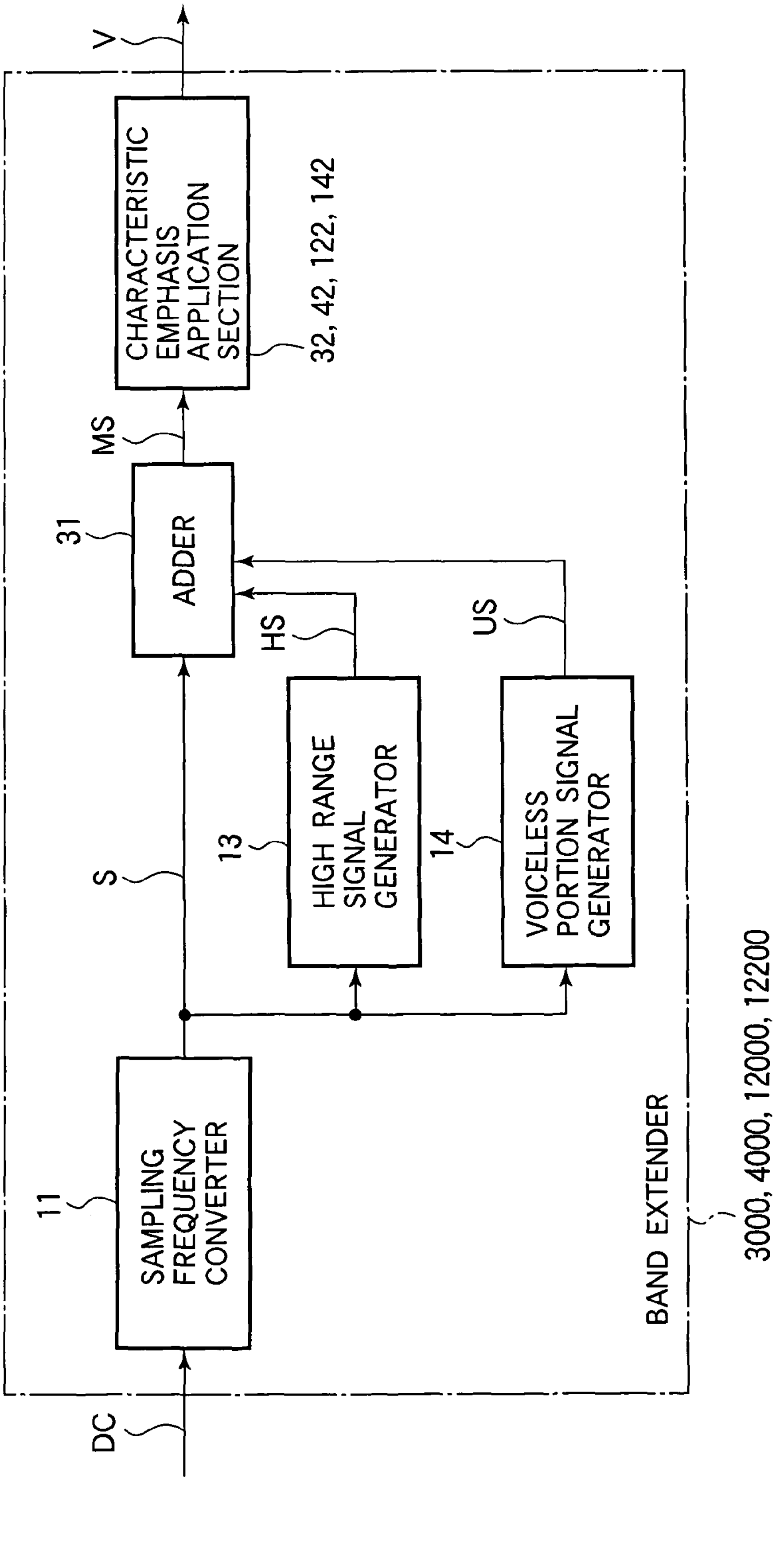
FIG. 4 is a functional block diagram showing an internal structure of a band extender according to the third, fourth, twelfth, and thirteenth embodiments.

FIG. 4 is a functional block diagram showing a structure of a band extender 1000 according to the third embodiment. Constitutional elements in FIG. 4 that are the same as or correspond to those in the above-described first and second embodiments are assigned the same reference numerals or characters.

Further, the band extender of the third embodiment performs the processing every time one audio frame is input to it, in a similar manner to the first and second embodiments.

As shown in FIG. 4, the band extender 3000 of the third embodiment includes at least a sampling frequency converter 11, a high range signal generator 13, a voiceless portion signal generator 14, an adder 31, and a characteristic emphasis application section 32.

The band extender 3000 of the third embodiment has different structures from those of the first and second embodiments in points that the characteristic emphasis application section 32 is provided in place of the low range characteristic application section 22 and the low pass filter 17, and the adder 31 has a different structure.

The adder 31 receives the converted original signal S, a synthesized high range signal HS, and a synthesized voiceless portion signal US, and outputs an added synthesized signal MS to the characteristic emphasis application section 32.

The characteristic emphasis application section 32 receives the added synthesized signal MS from the adder 31, and outputs a band extended signal V.

Although in the third embodiment, the characteristic emphasis application section 32 is disposed at immediately downstream stage of the adder 31, it may be disposed at any other position as long as it can apply the characteristic component in the low range portion. For example, the characteristic emphasis application section 32 may be disposed at the immediately downstream stage or the immediately upstream stage of the sampling frequency converter 11.

Further, although in the third embodiment, a description is made as to a case where only the characteristic emphasis application section 32 is provided, the component extractor 25, the signal component determination section 24, the switch 26, and the characteristic non-application section 27 described in the second embodiment in addition to the characteristic emphasis application section 32 described in the third embodiment may be disposed at a position of the characteristic emphasis application section 32 in FIG. 4. Furthermore, in the below-described embodiments, a description will be made as to examples in which only the characteristic emphasis application section is disposed similarly.

<C-2> Operation in Third Embodiment

Next, a description will be made as to operation of the band extender 3000 of the third embodiment.

When receiving the converted original signal S, the synthesized high range signal HS, and the synthesized voiceless portion signal US, the adder 31 adds these three kinds of signals to output a result of the adding as the added synthesized signal MS.

Further, the adder 15 may use weighting coefficients in the step of adding these three kinds of signals. Furthermore, the weighting coefficients can be set arbitrarily by the designer so as to improve the quality of the output voice.

When receiving the added synthesized signal MS from the adder 31, the characteristic emphasis application section 32 causes the converted original signal S to pass through the amplifier circuit so as to amplify the arbitrary frequency component of the converted original signal S, and output a result of the amplifying as the band extended signal V. Although this amplifier circuit may be, for example, the amplifier circuit described in the first embodiment, it is not limited to the circuit described in the first embodiment and other means can be adopted as long as it can amplify the frequency component of a predetermined frequency. Although in the third embodiment, a frequency of the components to be amplified is 180 Hz, it is not limited to this value.

In the third embodiment, since the characteristic of the low range portion can be applied to the entire generated waveform, the low pass filter can be omitted. Furthermore, in the conventional art, the frequency regions synthesized by the adder are defined so that the frequency region of the synthesized low range signal LS and the frequency region of the converted original signal S are adjacent and the frequency region of the converted original signal S and the frequency region of the synthesized high range signal HS are also adjacent, but in the third embodiment, the frequency region of the synthesized low range signal LS and the frequency region of the converted original signal S need to be adjacent. Therefore, it is possible to reduce an unusual sound signal generated between the two signals due to a phase shift in the time of the synthesizing and/or a mismatch of the waveform structure.

Furthermore, as has been described above, the characteristic emphasis application section 32 in the third embodiment has a function of applying characteristic component of the low range portion, and the band extended signal V may finally be a signal, the low range portion of which is emphasized. Therefore, the position of the characteristic emphasis application section 32 is not limited to the position of the downstream stage of the adder 31 as shown in FIG. 4. The position of the characteristic emphasis application section 32 may be any of other positions, and in this case, there is an advantage similar to that of the third embodiment.

<C-3> Effects in Third Embodiment

As has been described above, in the third embodiment, since the low range characteristic application section is not used for generating the synthesized low range signal, but the characteristic is applied to the entire generated waveform, the overlapping portion of the signals of the frequency regions can be reduced, and as a result, it is possible to suppress an unusual sound resulting from a phase shift that often takes place when the signals are synthesized. In terms of a result of the output, the function of adding the low band component is not impaired similarly, and therefore this embodiment has the same advantage as that of the first and second embodiments. As a result of this, the sound quality of the output signal can be further improved.

《D》 Fourth Embodiment

Next, a band converted signal generator and a band extender according to the fourth embodiment of the present invention will be described with reference to FIG. 4 and FIG. 5.

<D-1> Structure in Fourth Embodiment

Although the band extender 4000 of the fourth embodiment corresponds to that of the third embodiment, it is different from that of the third embodiment in a point of a function and structure of the characteristic emphasis application section 42. Therefore, a description will be made with emphasis on a point of a function of the characteristic emphasis application section 42.

Figure 5:
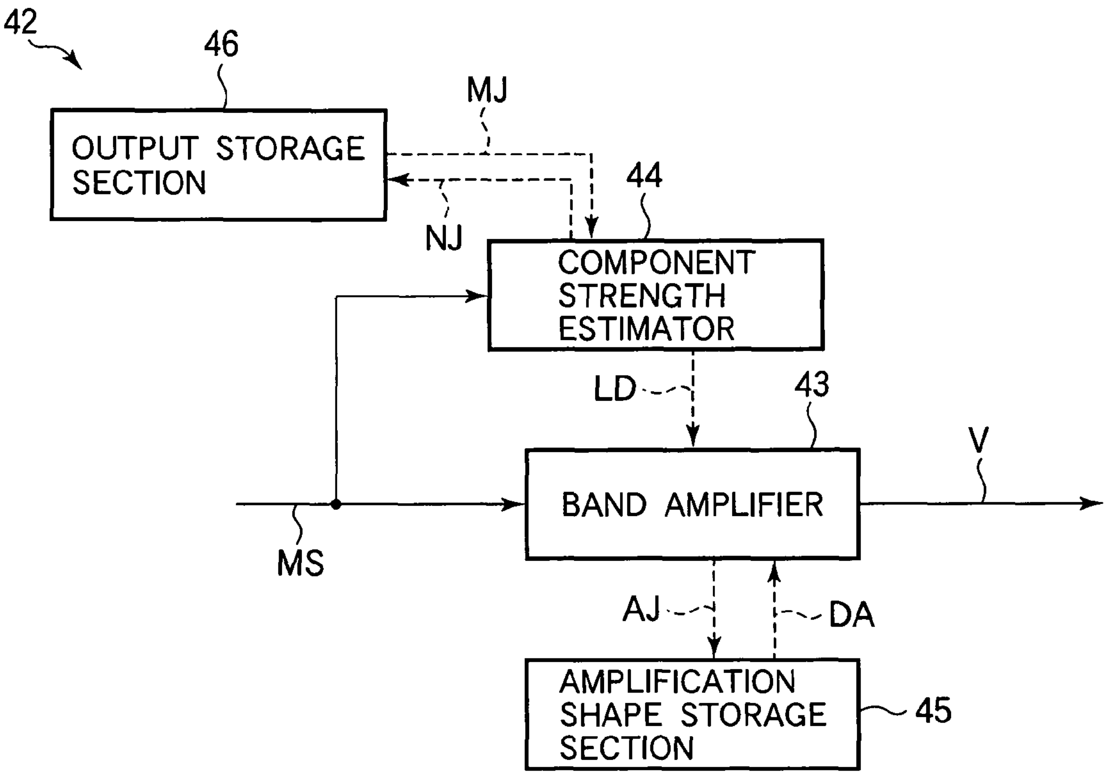
FIG. 5 is a functional block diagram showing an internal structure of a characteristic emphasis application section in the fourth embodiment.

FIG. 5 is a functional block diagram showing the characteristic emphasis application section 42 in the fourth embodiment.

Further, the band extender 4000 of the fourth embodiment performs the processing every time one audio frame is input to it, in a similar manner to the first to third embodiments.

Further, although in the fourth embodiment, the characteristic emphasis application section 42 is disposed at the downstream stage of the adder 31 in a similar manner to the above-mentioned third embodiment, the characteristic emphasis application section 42 can be disposed at an arbitrary position. Therefore, the characteristic emphasis application section 42 may be disposed at the immediately upstream of the sampling frequency converter 11 or so as to be disposed in parallel to the high range signal generator 13.

As shown in FIG. 5, the characteristic emphasis application section 42 of the fourth embodiment includes a component strength estimator 44, a band amplifier 43, an amplification shape storage section 45, and an output storage section 46.

The component strength estimator 44 receives the added synthesized signal MS from the adder 31, receives the output component information MJ from the output storage section 46, outputs component strength information NJ to the output storage section 46, and outputs strength estimation information LD to the band amplifier 43.

The band amplifier 43 receives the added synthesized signal MS from the adder 31 and the strength estimation information LD from the component strength estimator 44. Further, the band amplifier 43 outputs signal component information AJ to the amplification shape storage section 45, and receives amplification shape information DA from the amplification shape storage section 45. Furthermore, the band amplifier 43 outputs a result of the processing as the band extended signal V.

The output storage section 46 receives the component strength information NJ from the component strength estimator 44, and outputs the output component information MJ to the component strength estimator 44.

The amplification shape storage section 45 receives the amplification shape request information AJ from the band amplifier 43, and outputs the amplification shape information DA to the band amplifier 43. The amplification shape information DA means an amplification shape used for the amplifying process in the band amplifier 43, and is stored in the frequency amplification shape storage section 45. This amplification shape information DA is, for example, a filter coefficient(s) of the amplification filter. The filter coefficients are composed of a group of arbitrary kinds of filter coefficients established in advance, and the amplification amounts of the respective filter coefficients are set to different values.

<D-2> Operation in Fourth Embodiment

Next, a description will be made as to operation of the characteristic emphasis application section 42 of the band extender 4000 according to the fourth embodiment.

As will be described below, the output storage section 46 receives the component strength information NJ from the component strength estimator 44, and stores the component strength information NJ in itself. Further, the output storage section 46 outputs information used for processing in the component strength estimator 44 and selected from the stored component strength information NJ, as will be described below, as the output component information MJ to the component strength estimator 44. Furthermore, a storage capacity of the output storage section 46 can be arbitrarily set by the designer, but in the fourth embodiment, it is set so as to be capable of storing information of 30 ms (three audio frames).

When receiving the added synthesized signal MS and the output component information MJ, the component strength estimator 44 estimates a signal component strength of the original signal area of the added synthesized voice signal MS and a signal component strength of the low range portion.

In the fourth embodiment and the following embodiments, a band limited frequency area below 300 Hz is referred to as a "low range signal area" and a frequency area not less than 300 Hz included in the narrow-band signal is referred to as an "original signal area".

In the fourth embodiment, the signal component strength in the low range signal area is indicated by a root mean square power of the signal that has passed through the band pass filter, a pass band of which is a range from 180 Hz to 220 Hz. The signal component strength in the original signal area is indicated by a root mean square power of the signal that has passed through the band pass filter, a pass band of which is a range from 300 Hz to 340 Hz.

The pass bands of the band pass filter are not limited to the above-mentioned frequency ranges. For example, the signal component strength of the low range signal area may be a root mean square power of the entire low range. Furthermore, another scale may be used in a method for obtaining the signal strength.

The component strength estimator 44 compares the signal component strength and the past signal component strength received from the output storage section 46 as the output component information MJ, determines whether the emphasis is possible (executable) or not, calculates a required amplification amount, and outputs a result of the determining and the amplification amount as the strength estimation information LD to the band amplifier 43. Furthermore, the component strength estimator 44 outputs a signal component strength of the added synthesized signal MS as the original component information NJ to the output storage section 46.

The component strength estimator 44 determines whether the emphasis is executable or non-executable as follows. For example, it is determined to be an emphasis executable state if a difference between the component strength of the original signal area in the original frame and the component strength of the low range signal area is larger than 25 dB and an attenuation amount is set in such a way that a difference between the component strengths of the frequency components in the frequency to be emphasized of the past two audio frames is below 15 dB, while it is determined to be an emphasis non-executable state if otherwise.

Further, a threshold of the difference between the component strength of the original signal area in the original frame and the component strength of the low range signal area is not limited to 25 dB, and other values can be adopted. Furthermore, the attenuation amount of the component strength of the frequency component in the low range signal area and a period of time between two component strengths to be compared, used for obtaining the attenuation amount (between past two frames in this description) are not limited to these values. Moreover, other methods can be adopted as a method for determining whether the emphasis is executable or non-executable, but it is necessary that the method is capable of determining whether there is sufficient frequency components in the low range signal area or not.

When it is an emphasis executable state, the component strength estimator 44 outputs the strength estimation information LD indicating a difference between the component strength of the original signal area in the above-mentioned original frame and the component strength of the frequency to be emphasized.

On the other hand, when it is determined to be an emphasis non-executable state, the data indicating that the emphasis is not executed (e.g., the data having a component strength of a value of zero) is output as the strength estimation information LD. In the fourth embodiment, if it is the emphasis non-executable state, the low band component is not emphasized, but instead of this processing, the amplification by the predetermined amplification amount (e.g., 6 dB) may be adopted. The same or similar processing may also be executed in the following embodiments.

When receiving the strength estimation information LD and the added synthesized signal MS, the band amplifier 43 extracts a gain used for the amplification from the strength estimation information LD and outputs the amplification shape request information AJ to the amplification shape storage section 45.

Furthermore, when reviving the amplification shape information DA used for the amplification from the amplification shape storage section 45, the band amplifier 43 amplifies the added synthesized signal MS in accordance with the amplification shape information DA, thereby outputting the band extended signal V.

The amplification shape request information AJ indicates an amplification amount used for amplifying a signal, and it is information proportional to a difference between the component strength of the original signal area included in the strength estimation information LD and the component strength of the low range signal. Furthermore, for example, the amplification shape information DA is information required for constructing the amplifier circuit for amplifying the specific frequency, such as the filter coefficient of the amplification filter.

When receiving the amplification shape request information AJ from the band amplifier 43, the amplification shape storage section 45 selects the amplification shape used for amplifying a signal by the necessary amount, thereby outputting the amplification shape information DA to the band amplifier 43.

The amplification shape stored in the amplification shape storage section 45 is, for example, data including the filter coefficients of the amplification filter having amplification amounts of 3 dB, 6 dB, and 10 dB. In this case, the amplification shape information DA indicates a filter coefficient selected from the filter coefficients of the above-mentioned amplification filter. However, this stored amplification shape may be information required for amplifying the added synthesized signal MS in the band amplifier 43, and therefore it is not limited to this filter coefficient. Furthermore, the kinds of the stored amplification amounts are not limited to three kinds, and each value of the amplification amounts also is not limited to this value.

<D-3> Effects in Fourth Embodiment

As has been described above, in the fourth embodiment, the amplification amount can be changed in accordance with the signal strengths received from the component strength estimator and the amplification amount storage section, and therefore the sound level of the low range can be compensated. Furthermore, in this embodiment, in terms of a result of the output, the function of adding the low band component is not impaired similarly, and this embodiment has the same advantage as that of the first to third embodiments. As a result of this, the sound quality of the output signal can be further improved.

《E》 Fifth Embodiment

Next, a band converted signal generator and a band extender according to the fifth embodiment of the present invention will be described with reference to FIG. 6 and FIG. 7.

<E-1> Structure in Fifth Embodiment

Figure 6:
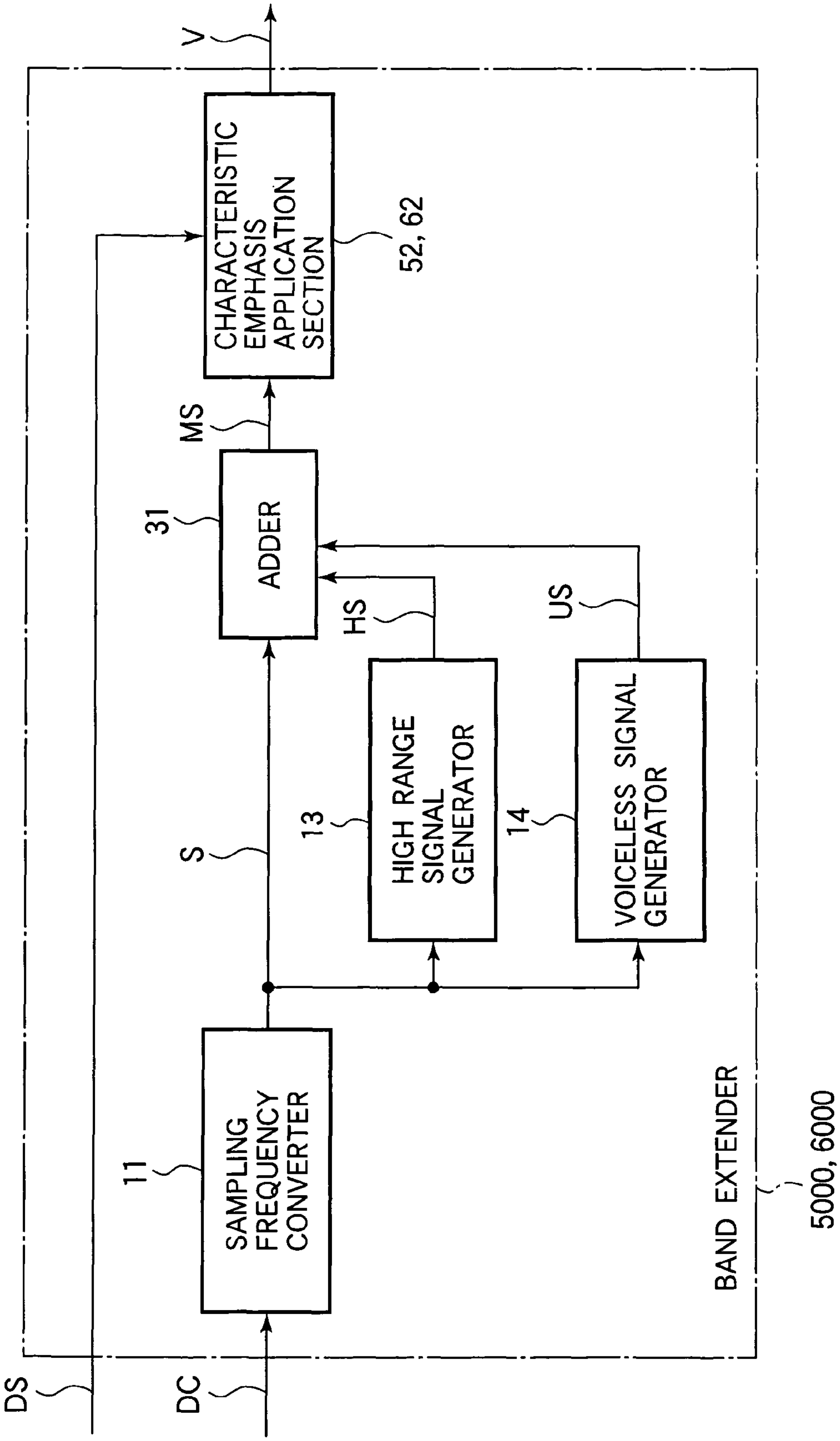
FIG. 6 is a functional block diagram showing an internal structure of a band extender according to the fifth and sixth embodiments.

FIG. 6 is a functional block diagram showing a structure of a band extender 5000 of the fifth embodiment. Furthermore, the band extender 5000 of the fifth embodiment also performs the processing every time one audio frame is input to it, in a similar manner to the first to fourth embodiments.

As shown in FIG. 6, the band extender 5000 of the fifth embodiment includes at least a sampling frequency converter 11, a high range signal generator 13, a voiceless portion signal generator 14, an adder 31, and a characteristic emphasis application section 52.

Further, constitutional elements in FIG. 6 that are the same as or correspond to those shown in the above-described FIG. 1 to FIG. 5 are assigned the same reference numerals or characters.

The fifth embodiment is different from the first to fourth embodiments in points of the addition of the component search signal DS and the internal structure of the characteristic emphasis application section 52. Therefore, these functions and structure will be described.

The band extender 5000 receives the component search signal DS in addition to the band limited signal DC.

The component search signal DS is a signal used for searching the frequency component included in the narrowband signal DC received by the band extender 5000 and/or used for determining whether this signal is an absence-of-sound signal or a presence-of-sound signal.

In the fifth embodiment, the component search signal DS is used for estimating a fundamental frequency of the added synthesized signal MS input to the characteristic emphasis application section 52 by the frequency estimator 56 disposed in the below-described characteristic emphasis application section 52.

Although in the fifth embodiment, a description is made as to a case where the component search signal DS is the converted original signal S, this component search signal DS may be another signal corresponding to the added synthesized signal MS received by the low range characteristic application section 52, for example, it may be the band limited signal DC or another signal. Furthermore, if delays take place in the sampling frequency converter 11 and/or the adder 31, etc., it is necessary to consider a countermeasure against the delays of the component search signal DS.

Figure 7:
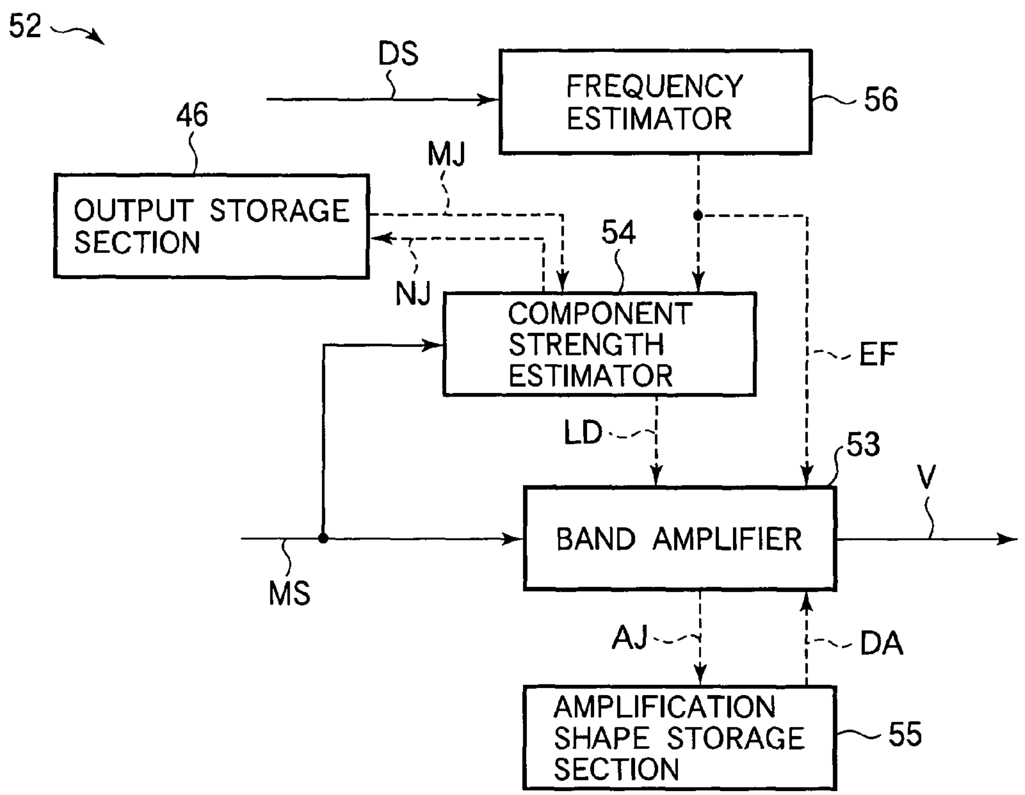
FIG. 7 is a functional block diagram showing an internal structure of a characteristic emphasis application section in the fifth embodiment.

FIG. 7 is a functional block diagram used for describing a function of the characteristic emphasis application section 52 in the fifth embodiment.

As shown in FIG. 7, the characteristic emphasis application section 52 of the fifth embodiment includes at least an output storage section 46, a band amplifier 53, a component strength estimator 54, an amplification shape storage section 55, and a frequency estimator 56. Further, although the description will be made as to a case where the output storage section 46 is provided in the fifth embodiment, if a function of the output storage section 46 can be substituted by another functional means, it is possible to adopt a structure not including the output storage section 46.

The frequency estimator 56 receives the component search signal DS, and outputs signal period information EF.

The component strength estimator 54 receives the added synthesized signal MS from the adder 31, receives the output component information MJ from the output storage section 46, receives the signal period information EF from the frequency estimator 56, outputs the strength estimation information LD to the band amplifier 53, and outputs the component strength information NJ to the output storage section 46.

The band amplifier 53 receives the strength estimation information LD from the component strength estimator 54, receives the signal period information EF from the frequency estimator 56, receives the converted original signal S from the adder 31, receives the amplification shape information DA from the amplification shape storage section 55, and outputs the amplification shape request information AJ and the band extended signal V.

The amplification shape storage section 55 receives the amplification shape request information AJ from the band amplifier 53, and output the amplification shape information DA to the band amplifier 53.

In the fifth embodiment, the amplification shape information DA is composed of, for example, the amplification filter coefficients. The amplification shape storage section 55 stores a plurality of filter coefficient groups of the amplification filter coefficients, number of which is the number of kinds of the arbitrary frequencies, and each coefficient group indicating an arbitrary number of amplification amounts for each frequency.

<E-2> Operation in Fifth Embodiment

Next, a description will be made as to operation of the characteristic emphasis application section 52 of the band extender 5000 according to the fifth embodiment.

When receiving the added synthesized signal MS and the component search signal DS from the adder 31, the characteristic emphasis application section 52 executes the below-described processing and then generates the band extended signal V to output it. As has been described above, the component search signal DS is a signal corresponding to the band limited signal DC, for example, the converted original signal S.

Next, a description will be made as to operation in the characteristic emphasis application section 52.

When receiving the component search signal DS, the frequency estimator 56 estimates a fundamental frequency of the added synthesized signal MS from the component search signal DS, and outputs the fundamental frequency as the signal period information EF to the component strength estimator 54 and the band amplifier 53.

The frequency estimator 56 needs to be capable of outputting frequencies with enough resolution for selecting a kind of the frequency stored in the below-mentioned amplification shape storage section 55. In the fifth embodiment, for example, an arbitrary number of filter banks are prepared in a region from 300 Hz to 900 Hz, the filter banks receives the component search signal DS, two filters whose outputs are local maximum are selected from a result of the outputs from the filter banks, and a difference between the frequencies of these filter banks are regarded as a frequency of the present frame. Further, the above-mentioned range of the filter banks is not limited to this value. Furthermore, another means can be adopted as long as it can output a frequency with enough resolution for selecting kinds of frequencies stored in the below-described amplification shape storage section 55.

The component strength estimator 54 operates in the approximately same manner as the component strength estimator 44 described in the fourth embodiment, but is different from the component strength estimator 44 in a point that the component estimation in the low range signal area is a component estimation in the vicinity of a value of the fundamental frequency included in the signal period information EF.

The band amplifier 53 operates in an approximately similar manner to the band amplifier 43 described in the fourth embodiment, but it operates differently in points of receipt of the signal period information EF and the content of the amplification shape request information AJ. Although the amplification shape request information AJ in the fourth embodiment indicates only a gain used for the amplification, the amplification shape request information AJ in the fifth embodiment also indicates a frequency to be amplified in addition to a gain used for the amplification. The frequency to be amplified is obtained by extracting a fundamental frequency to be amplified from the signal period information EF.

In the amplification shape storage section 55, a frequency to be amplified and an amplification amount (gain) is extracted from the received amplification shape request information AJ, the most appropriate amplification shape is selected from the amplification shapes stored in advance to be output as an amplification shape information DA to the band amplifier 53.

Although the amplification shape storage section 45 in the fourth embodiment selects only the amplification amount, the amplification shape storage section 55 in the fifth embodiment also selects an amplification frequency in addition to the amplification amount.

The amplification shape stored in the amplification shape storage section 55 indicates the filter coefficients of the amplification filter including, for example, amplification frequencies of 80 Hz, 160 Hz, and 240 Hz, and amplification amounts of 3 dB, 6 dB, and 10 dB corresponding to the amplification frequencies respectively. However, the values of the amplification frequencies and values of the amplification amounts are not limited to these values, and the kinds of the frequencies and kinds of the amplification amounts are not limited to these three kinds.

<E-3> Effects in Fifth Embodiment

As has been described above, in the fifth embodiment, since not only the amplification amounts used for the amplification but also the frequencies used for the amplification can be selected, it is possible to implement the appropriate amplification for the input signal, thereby making it possible to cause the user to hear the sound having a spacious feeling of the sound of the low range portion. Furthermore, in this embodiment, in terms of a result of the output, the function of adding the low band component is not impaired similarly, and therefore this embodiment has the same advantage as that of the first to fourth embodiments. As a result of this, the sound quality of the output signal can be further improved.

《F》 Sixth Embodiment

Next, a band converted signal generator and a band extender according to the sixth embodiment of the present invention will be described with reference to the drawings.

<F-1> Structure in Sixth Embodiment

Since the structure of the band extender 6000 of the sixth embodiment corresponds to that of FIG. 6, which is described as the structure of the fifth embodiment, FIG. 6 is also used for explaining the sixth embodiment. Further, the band extender 6000 of the sixth embodiment also performs each function every time one audio frame is input to it.

The sixth embodiment is different from the fifth embodiment in a point of the internal structure of the characteristic emphasis application section 62. Therefore, the structure of the characteristic emphasis application section 62 will be described in detail.

Figure 8:
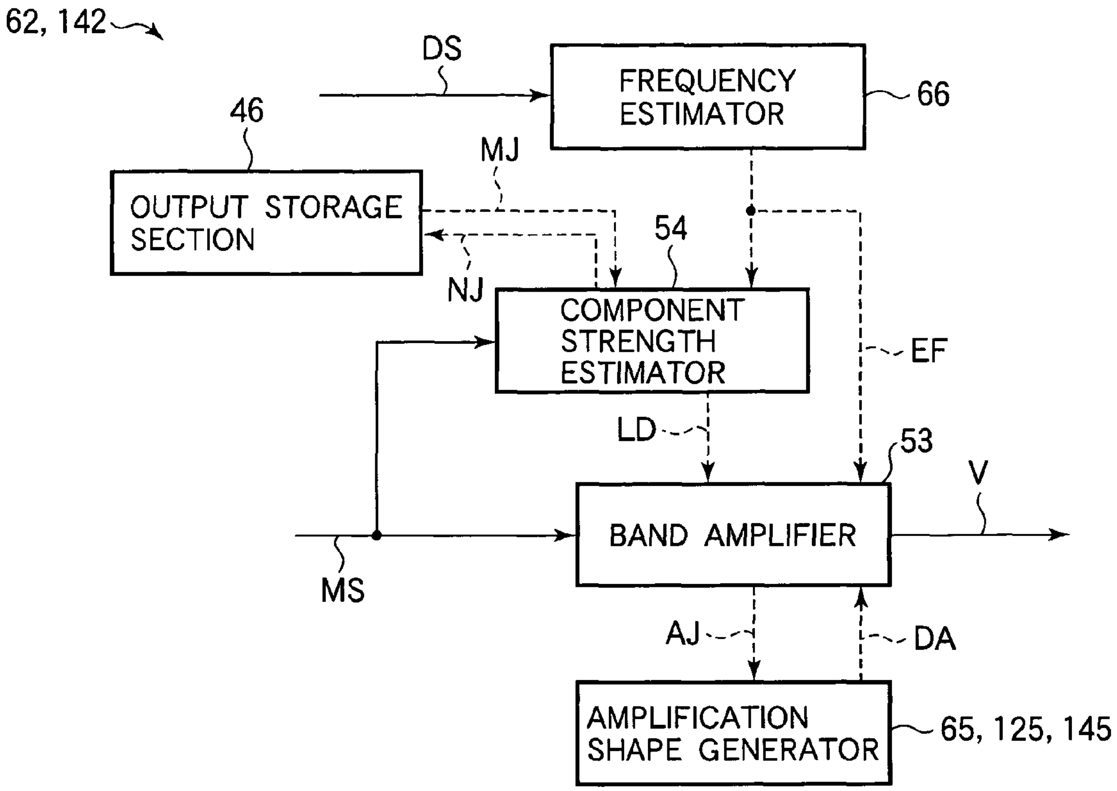
FIG. 8 is a functional block diagram showing an internal structure of a characteristic emphasis application section in the sixth embodiment.

FIG. 8 is a functional block diagram showing an internal structure of the characteristic emphasis application section 62 in the sixth embodiment. As shown in FIG. 8, the characteristic emphasis application section 62 of the sixth embodiment includes at least an output storage section 46, a band amplifier 53, a component strength estimator 54, an amplification shape storage section 65, and a frequency estimator 66.

The characteristic emphasis application section 62 is different from the characteristic emphasis application section 52 of the fifth embodiment in a point of the internal structure, but the input/outputs of both embodiments are the same to each other. Therefore, the component search signals DS of both embodiments are the same to each other, and in the sixth embodiment, it is denoted as the converted original signal S, for example.

Figure 9:
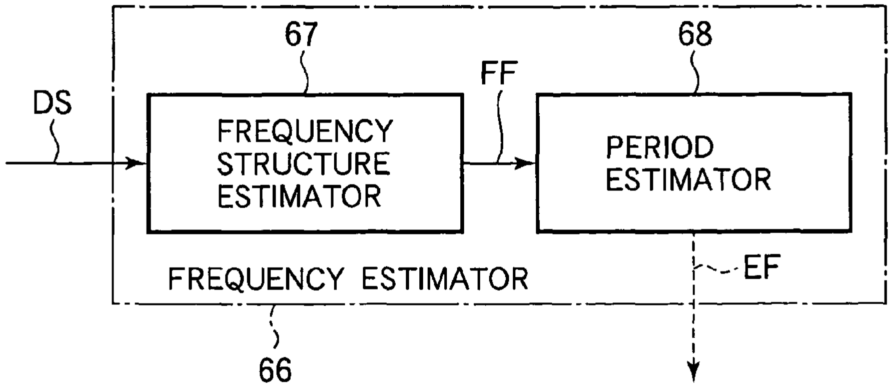
FIG. 9 is a functional block diagram showing an internal structure of a frequency estimator in the sixth embodiment.

FIG. 9 is a functional block diagram showing an internal structure of the frequency estimator 66. The frequency estimator 66 includes the frequency structure estimator 67 and the period estimator 68.

The frequency structure estimator 67 receives the component search signal DS, and outputs the frequency structure series FF to the period estimator 68.

The period estimator 68 receives the frequency structure series FF from the frequency structure estimator 67, and outputs the signal period information EF.

Referring to FIG. 8 again, the frequency estimator 66 receives the component search signal DS, and outputs the signal period information EF to the component strength estimator 54 and the band amplifier 53.

The amplification shape generator 65 receives the amplification shape request information AJ from the band amplifier 53, and outputs the amplitude shape information DA to the band amplifier 53.

Figure 10:
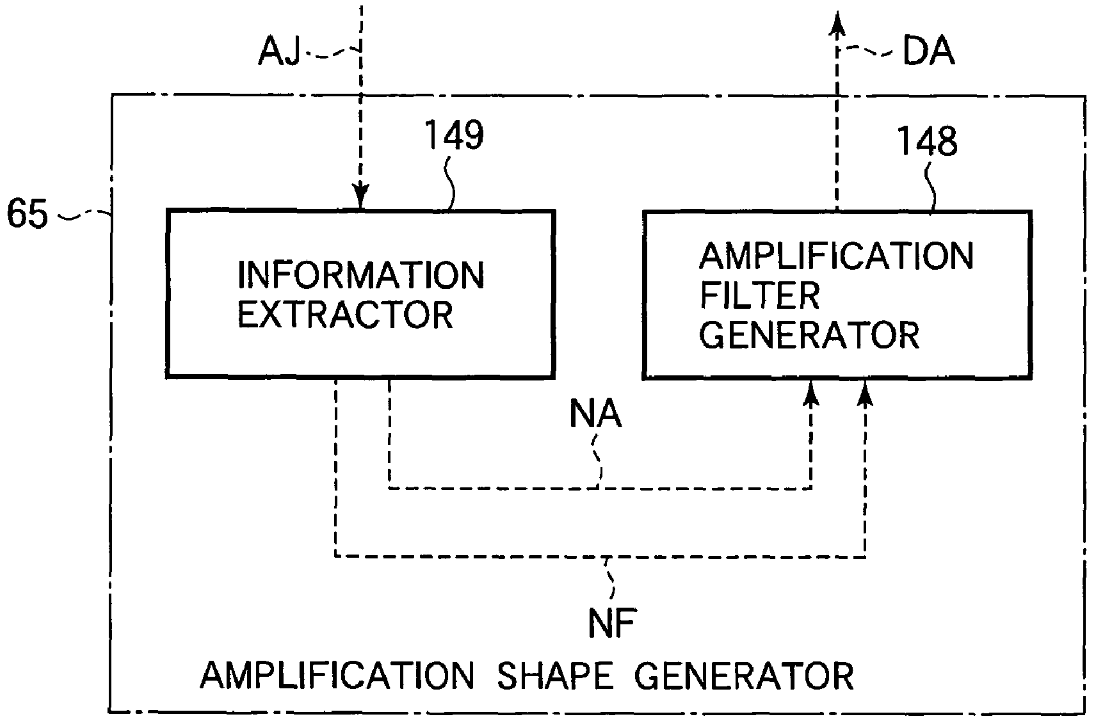
FIG. 10 is a functional block diagram showing an internal structure of an amplification shape generator in the sixth embodiment.

FIG. 10 is a functional block diagram showing an internal structure of an amplification shape generator 65 in the sixth embodiment. The amplification shape generator 65 in the sixth embodiment includes an information extractor 149 and an amplification filter generator 148.

<F-2> Operation in Sixth Embodiment

Next, a description will be made as to operation of characteristic emphasis application section 62 of the band extender 6000 of the sixth embodiment. Further, the description will be made with emphasis on different operation from the operation in the first to fifth embodiments.

When receiving the component search signal DS, the frequency estimator 66 estimates a fundamental frequency of the received added synthesized signal MS in accordance with the below-described method, and outputs the estimated fundamental frequency as a signal period information EF to the component strength estimator 54 and the band amplifier 53.

The amplification shape generator 65 receives the amplification shape request information AJ that includes the strength estimation information LD generated by the component strength estimator 54 and the signal period information EF generated by the frequency estimator 66.

After that, in the information extractor 149 of the amplification shape generator 65, the amplification frequency NF as a frequency to be amplified and the component strength difference NA are extracted from the amplification shape request information AJ. When the amplification frequency NF and the component strength difference NA are input to the amplification filter generator 148, the amplification filter generator 148 generate the amplification filter having the maximum amplification amount that is an amplification frequency NF proportional to the signal strength difference NA, and outputs this amplification filter as the amplification shape information DA to the band amplifier 53.

At this time, an arbitrary number of kinds of amplification amounts of the amplification shape is prepared in advance in the amplification shape generator 65, and the most appropriate one is selected and used in accordance with the signal strength difference NA.

Although in the sixth embodiment, a finite number of amplification amounts are prepared in the amplification shape generator 65, the amplification shape generator 65 may be constructed so as to specify an arbitrary amplification amount. In the sixth embodiment, the amplification shape information DA may be, for example, the filter coefficients of the amplification filter, and a kind of the information is not limited as long as the information can specify the amplification shape uniquely.

Furthermore, the amplification filter is constructed by a combination of a band pass filter and an amplifier (both are not shown in the figures), and the band pass filter has, for example, a pass band between ±10 Hz from a fundamental frequency as a center extracted from the signal period information EF. This band pass filter is obtained, for example, by the method described in the document, Masaaki Mitani, "Digital Filter Design", Shokodo Co., Ltd., 1987, pp. 139 to 142, and by changing the low pass filter having the cutoff frequency 10 Hz to the above-mentioned band pass filter. Further, the cutoff frequency of the low pass filter and the pass band of the band pass filter are not limited to these values. Furthermore, the amplification amount of the amplifier may be decided on the basis of the input amplification amount. The amplification filter is not limited to a means of a combination of the above-mentioned band pass filter and the amplifier, but it may be another means of a combination of other filters as long as it can amplify the specific frequency or an amplification filter for amplifying the specific frequency.

Next, operation of the frequency estimator 66 will be described. When receiving the component search signal DS, the frequency structure estimator 67 estimates a frequency structure of the component search signal DS.

In the estimation of the frequency structure in the sixth embodiment, the input signal is converted to the frequency series using the well-known Fourier transform to obtain the frequency structure of the audio frame. Further, a method of estimating the frequency structure is not a method using the Fourier transform, but may be another method being capable of obtaining the frequency structure of the input signal.

After that, the estimated frequency structure is output to the period estimator 68 as a frequency structure series FF.

When receiving the frequency structure series FF from the frequency structure estimator 67, the period estimator 68 estimates the fundamental frequency from the frequency structure series FF to output this fundamental frequency as the signal period information EF.

Further, a method of estimating the fundamental frequency is, for example, a method of calculating an autocorrelation function of the frequency structure series FF and obtaining a delay amount when this autocorrelation function becomes a local maximum to estimate the fundamental frequency from the obtained delay amount. Furthermore, a method of estimating the fundamental frequency is not limited to this method, but it may be another well-known method of estimating the fundamental frequency. For example, the method may be a method of obtaining a local maximum of the frequency structure series FF from an inclination of the frequency structure series FF and/or other information to obtain a fundamental frequency from a minimum value of the local maximums of the frequency structure series FF or a length between arbitrary two local maximums.

<A-3> Effects in Sixth Embodiment

As has been described above, in the sixth embodiment, a frequency to be amplified can be set to an arbitrary frequency whenever necessary and an amplification amount can be set to an arbitrary number, and therefore it is possible to perform a more appropriate amplification for the input signal and to cause the user to hear the sound with a spacious feeling in a low range portion. Furthermore, in the sixth embodiment, in terms of a result of the output, the function of adding the low band component is not impaired similarly, and this embodiment has the same advantage as that of the first to fifth embodiments. As a result of this, the sound quality of the output signal can be further improved.

《G》 Seventh Embodiment

Next, a band converted signal generator and a band extender according to the seventh embodiment of the present invention will be described with reference to the drawings.

<G-1> Structure in Seventh Embodiment

Figure 11:
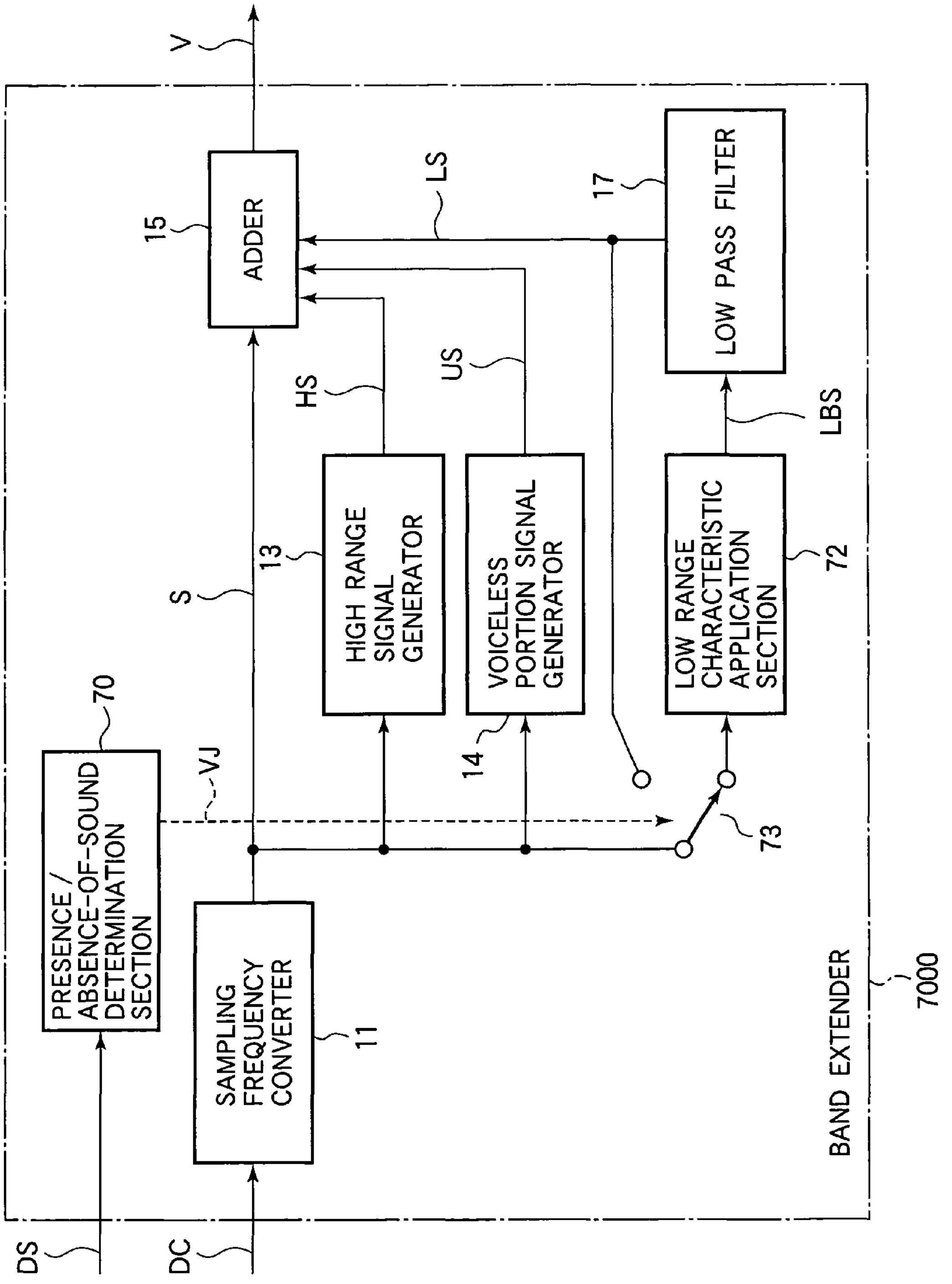
FIG. 11 is a functional block diagram showing an internal structure of a band extender according to the seventh embodiment.

FIG. 11 is a functional block diagram showing a structure of a band extender 7000 of the seventh embodiment. Functional means in FIG. 11 that are the same as or correspond to the constitutional elements in the first to sixth embodiments are assigned the same reference numerals or characters. Constitutional elements in FIG. 11 that operate in a similar manner to functional means in the first to sixth embodiments are assigned the same reference numerals or characters shown in FIG. 1 to FIG. 9. Furthermore, the band extender 7000 of the seventh embodiment performs each function every time one audio frame is input to it.

As shown in FIG. 11, a band extender 7000 of the seventh embodiment includes a sampling frequency converter 11, a high range signal generator 13, a voiceless portion signal generator 14, a low range characteristic application section 72, a low pass filter 17, an adder 15, a presence/absence-of-sound determination section 70, and a switch 73.

The band extender 7000 of the seventh embodiment is different from those of the first to sixth embodiments in points of provision of the presence/absence-of-sound determination section 70 and a structure of the switch 73.

The presence/absence-of-sound determination section 70 receives the component search signal DS and outputs presence/absence-of-sound determination information VJ to the switch 73. Although in the seventh embodiment, a description is made as to a case where the presence/absence-of-sound determination section 70 performs the presence/absence-of-sound determination on an audio frame-by-frame basis, a period between determinations is not limited to a specific period, and, for example, the determination whether the sound is present or not may be determined on a sample-by-sample basis or once for an arbitrary period of time.

Although the presence/absence-of-sound determination section 70 is a functional means provided within the band extender 7000 independently, another functional means (the switch 73 in the seventh embodiment) receiving the presence/ absence-of-sound determination information VJ may have a function of the presence/absence-of-sound determination section 70. In the following embodiments, a description will be made as to a case where the presence/absence-of-sound determination section 70 is an independent functional means.

The switch 73 receives the converted original signal S and the presence/absence-of-sound determination information VJ, and switches on the basis of the presence/absence-of-sound determination information VJ in such a way that either the converted original signal S is output to the low range characteristic application section 72 or is output to the adder 15 as it is.

Furthermore, although the switch 73 is shown as an independent functional means in FIG. 11, it is not limited to the structure shown in FIG. 11. A function of the switch 73 may be implemented by another functional means (e.g., an adder 15) disposed in the switch 73 as long as the same effects as the seventh embodiment can be obtained.

<G-2> Operation in Seventh Embodiment

Next, operation of the band extender 7000 of the seventh embodiment will be described. Further, a description will be made with emphasis on a different point from the first to sixth embodiments.

When receiving the component search signal DS, the presence/absence-of-sound determination section 70 determines whether the component search signal DS indicates presence-of-sound or absence-of-sound and outputs its determination result as the presence/absence-of-sound determination information VJ to the switch 73.

A method of determining the presence/absence of sound may be, for example, a method, in which it is determined to be a presence-of-sound when the well-known mean squared power in the input audio frame period is above the predetermined threshold and it is determined to be an absence-of-sound when otherwise. Further, a method of determining the presence/absence of sound may be another well-known method that is different from the above method, and is not limited as long as it can determine the presence/absence of sound. Furthermore, although in the seventh embodiment, as has been described above, a description is made as to a case where the determination of the presence/absence of sound is made on an audio frame-by-frame basis, a period between determinations is not limited to a specific period, and, for example, the determination whether the sound is present or not may be determined on a sample-by-sample basis or once for an arbitrary fixed time or once for a variable period of time.

Furthermore, the presence/absence-of-sound determination information VJ output from the presence/absence-of-sound determination section 70 may be a flag indicating effectiveness or ineffectiveness or may be a barometer (the mean-squared power in the seventh embodiment) used for the determination in the presence/absence-of-sound determination section 70.

The switch 73 switches its connection so as to flow the converted original signal S to the low range characteristic application section 72 when it is determined that the presence/absence-of-sound information VJ output from the presence/absence-of-sound determination section 70 indicates presence-of-sound, and switches its connection so as to flow the converted original signal S to the adder 15 to output it to the adder when otherwise. By this switching operation of the switch 73, the application of the low range characteristic component is not executed at the time of the absence of sound.

<G-3> Effects in Seventh Embodiment

As has been described above, in the seventh embodiment, the low range characteristic application section is caused to be operative only when necessary by determining the presence/absence of sound, and therefore the processing amount of the apparatus can be suppressed. Furthermore, since the amplification of the absence-of-sound portion which does not need to be amplified can be avoided, the sound quality of the output signal can be improved. Moreover, in terms of a result of the output, the function of adding the low band component is not impaired similarly, and therefore this embodiment has the same advantage as that of the other embodiments. As a result of this, the sound quality of the output signal can be further improved.

《H》 Eighth Embodiment

Next, a band converted signal generator and a band extender according to the eighth embodiment of the present invention will be described with reference to the drawings.

<H-1> Structure in Eighth Embodiment

Figure 12:
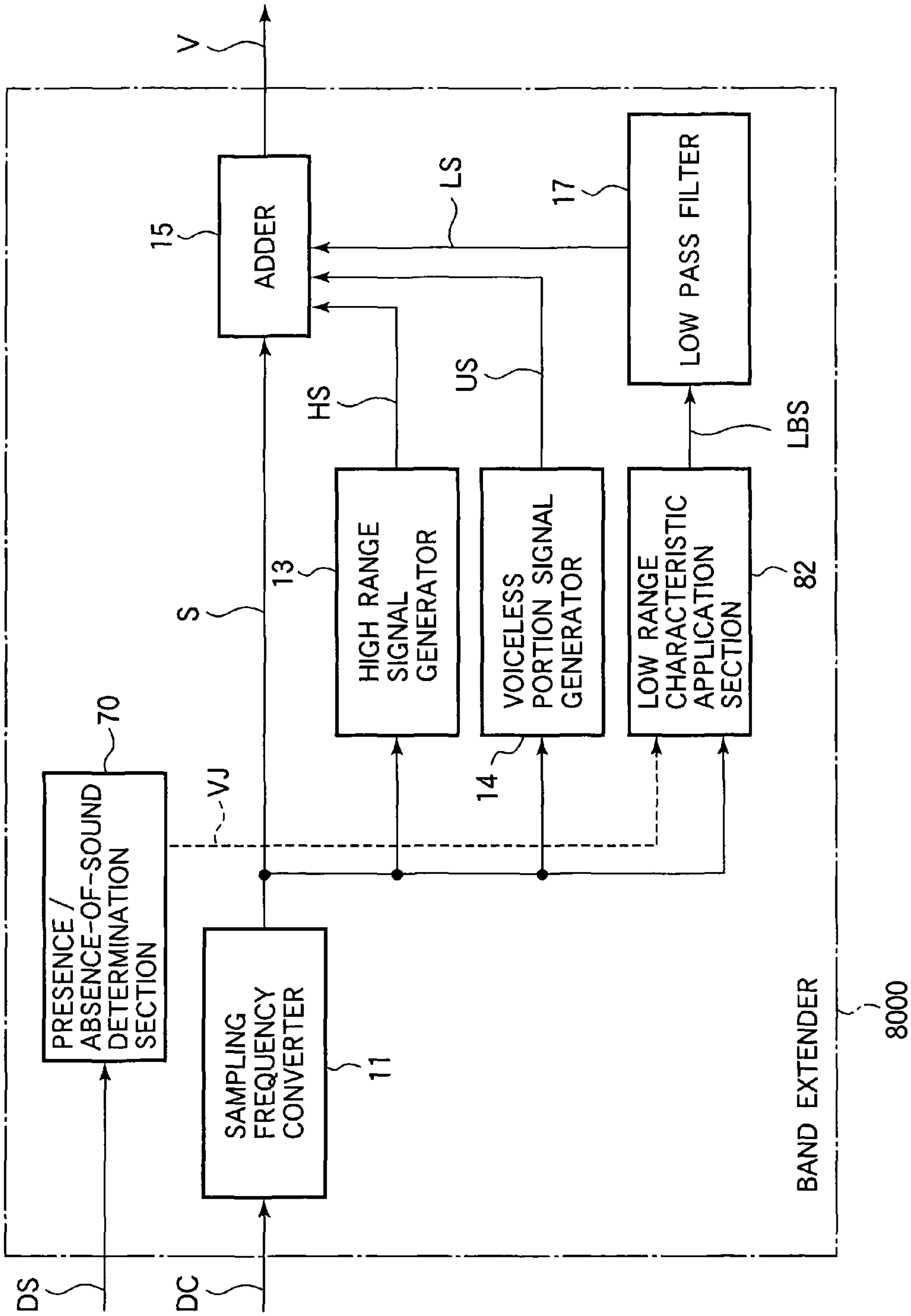
FIG. 12 is a functional block diagram showing an internal structure of a band extender according to the eighth embodiment.

FIG. 12 is a functional block diagram showing a structure of a band extender 8000 according to the eighth embodiment. Functional means in FIG. 12 that operate in a similar manner to those in the first to the seventh embodiments are assigned the same reference numerals or characters as those shown in FIG. 1 to FIG. 11. Furthermore, the band extender 8000 of the eighth embodiment performs each function every time one audio frame is input to it.

As shown in FIG. 12, the band extender 8000 of the eighth embodiment includes at least a sampling frequency converter 11, a high range signal generator 13, a voiceless portion signal generator 14, a low range characteristic application section 82, a low pass filter 17, an adder 15, and a presence/absence-of-sound determination section 70.

The band extender 8000 of the eighth embodiment is different from those of the first to seventh embodiments in a point of a function and structure of the low range characteristic application section 82.

The low range characteristic application section 82 receives the converted original signal S from the sampling frequency converter 11, receives the presence/absence-of-sound determination information VJ from the presence/absence-of-sound determination section 70, and outputs the low range characteristic application signal LBS to the low pass filter 17.

Figure 13:
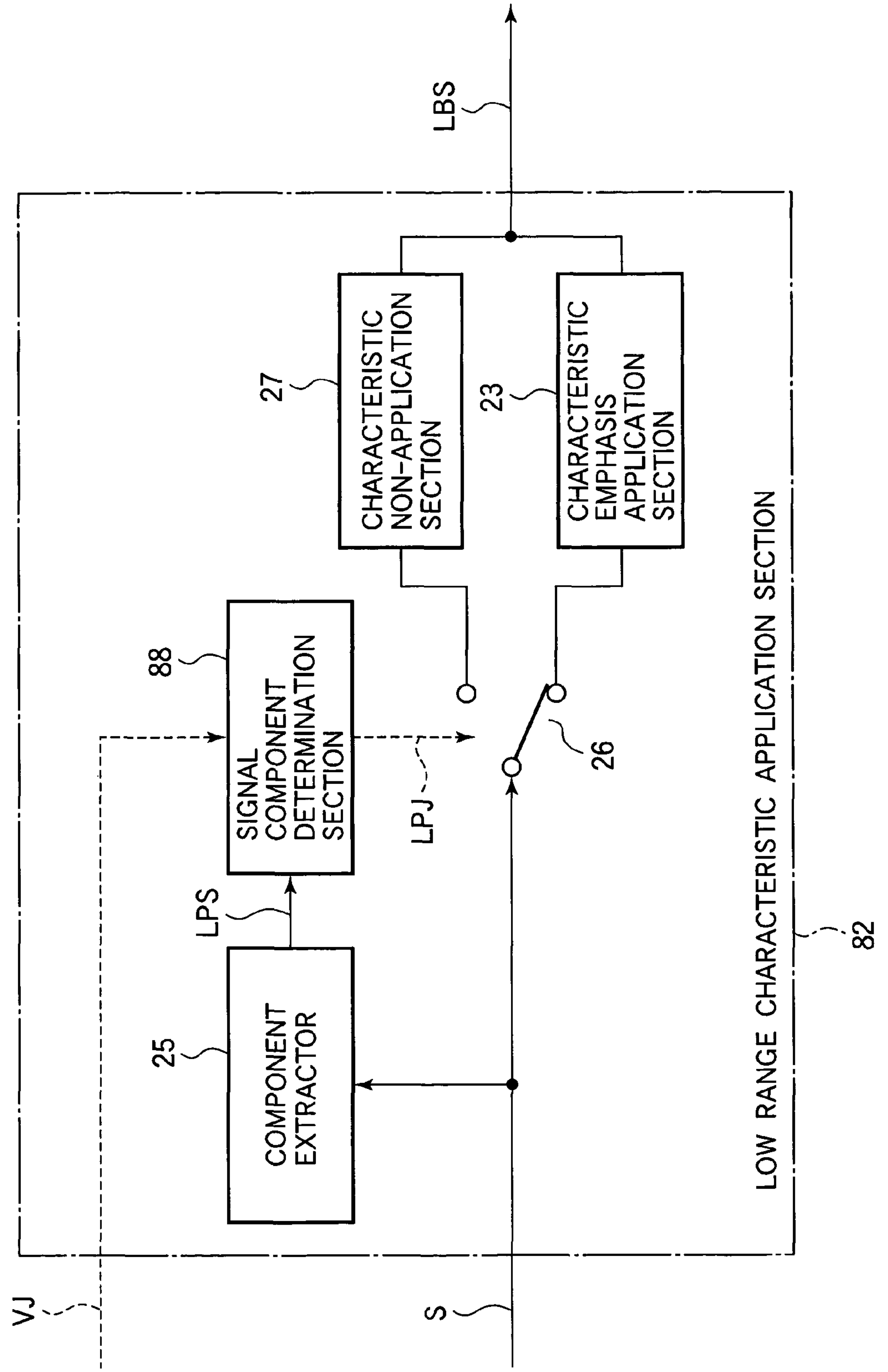
FIG. 13 is a functional block diagram showing an internal structure of a low range characteristic application section in the eighth embodiment.

FIG. 13 is a functional block diagram showing an internal structure of the low range characteristic application section 82 in the eighth embodiment. As shown in FIG. 13, the low range characteristic application section 82 in the eighth embodiment includes a component extractor 25, a signal component determination section 88, a switch 26, a characteristic non-application section 27, and a characteristic emphasis application section 23.

The signal component determination section 88 receives the component extraction signal LPS extracted from the component extractor 25, receives the presence/absence-of-sound determination information VJ from the presence/absence-of-sound determination section 70, and outputs the low range determination information LPJ to the switch 26.

<H-2> Operation in Eighth Embodiment

Next, a description will be made as to operation of the low range characteristic application section 82 in the band extender 8000 of the eighth embodiment. The operation of the eighth embodiment will be described with emphasis on differences as compared with the first to seventh embodiments.

The low range characteristic application section 82 receives the converted original signal S and the presence/absence-of-sound determination information VJ, and generates a signal, to which a low region characteristic component is applied, described later to output this signal as the low range characteristic application signal LBS.

Next, the operation of an internal structure of the low range characteristic application section 82 will be described.

The signal component determination section 88 receives the component extraction signal LPS from the component extractor 25 and the presence/absence-of-sound determination information VJ from the presence/absence-of-sound determination section 70.

At this time, if the presence/absence-of-sound determination information VJ indicates the presence of sound, the signal component determination section 88 performs the similar process to that described in the second embodiment and outputs the low range determination information LPJ to the switch 26.

On the other hand, when the presence/absence-of-sound determination information VJ indicates the absence of sound, it is determined that the low band component does not include effective components, information for causing the switch to switch its connection to the characteristic non-application section 27 is output to the switch 26 as the low range determination information LPJ.

In the eighth embodiment, when the low band component includes the effective component and the presence/absence-of-sound determination information VJ indicates the presence of sound, the signal component determination section 88 causes the switch 26 to switch its connection to the characteristic emphasis application section 23. However, on designer's own judgment, it is possible to design the apparatus in such a way that the signal component determination section 88 causes the switch 26 to switch its connection to the characteristic emphasis application section 23 when the low band component includes the effective component or when the presence/absence-of-sound determination information VJ indicates the presence of sound.

<H-3> Effects in Eighth Embodiment

As has been described above, in the eighth embodiment, the low range characteristic application section utilizes a result of the determination of the presence/absence of sound, and therefore the processing amount of the absence-of-sound portion in the apparatus can be suppressed. Furthermore, since the amplification is executed on the basis of both the determination of the effectiveness of the low band component and the determination of the presence/absence of sound, the application of the low range characteristic with higher accuracy can be implemented. As a result of this, the sound quality of the output signal can be improved. Moreover, in terms of a result of the output, the function of adding the low band component is not impaired similarly, and this embodiment has the same advantage as that of the other embodiments. As a result of this, the sound quality of the output signal can be further improved.

《I》 Ninth Embodiment

Next, a band converted signal generator and a band extender according to the ninth embodiment of the present invention will be described with reference to the drawings.

<I-1> Structure in Ninth Embodiment

Figure 14:
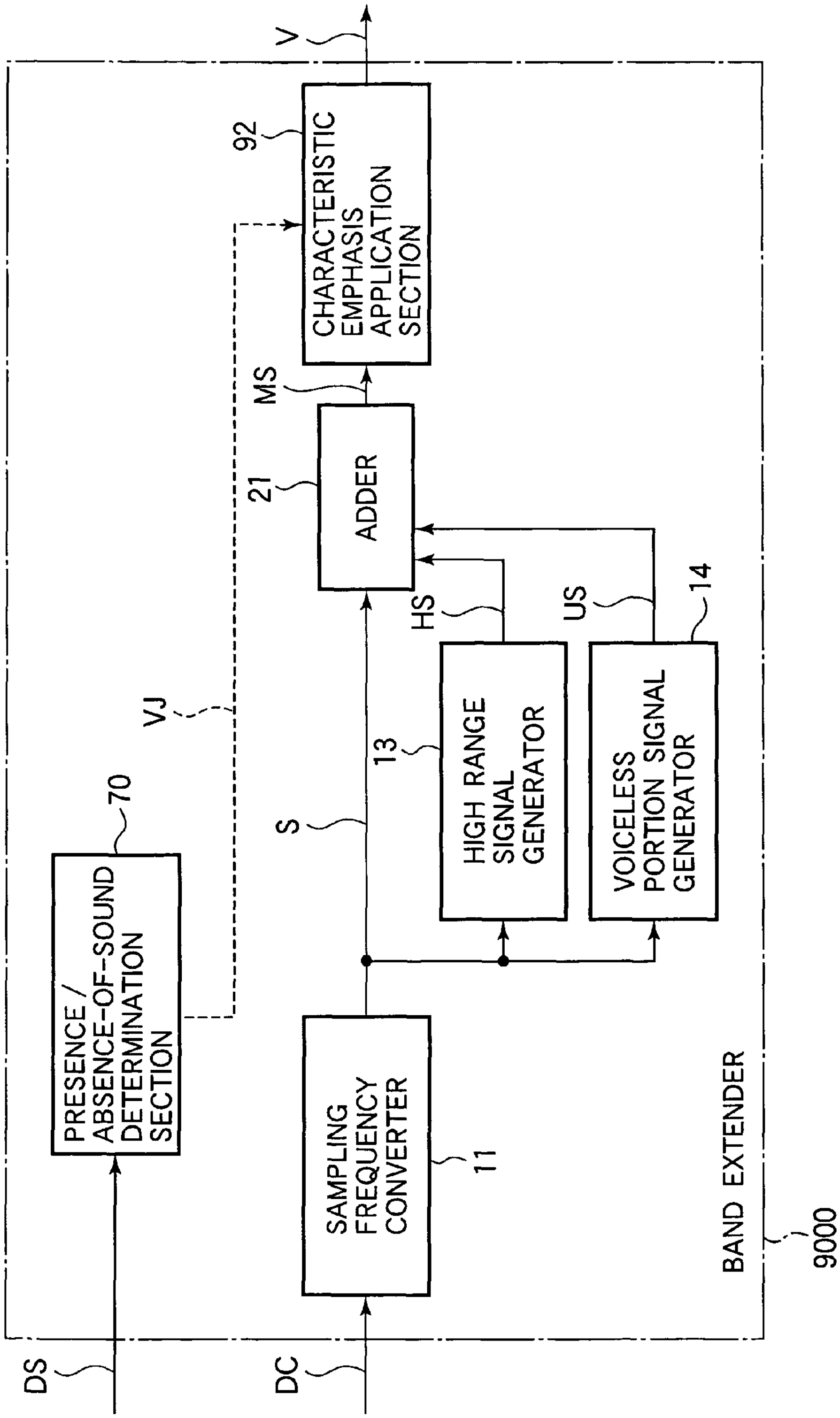
FIG. 14 is a functional block diagram showing an internal structure of a band extender according to the ninth embodiment.

FIG. 14 is a functional block diagram showing a structure of a band extender 9000 of the ninth embodiment. Constitutional elements in FIG. 14 that has substantially the same functions as those of the first to eighth embodiments are assigned the same reference numerals as those shown in FIG. 1 to FIG. 13. Furthermore, in the ninth embodiment, each function is implemented every time one audio frame is input.

As shown in FIG. 14, the band extender 9000 of the ninth embodiment includes a sampling frequency converter 11, a high range signal generator 13, a voiceless portion signal generator 14, an adder 21, a presence/absence-of-sound determination section 70, and a characteristic emphasis application section 92.

The ninth embodiment is different from the first to eighth embodiments in a point of a function of the characteristic emphasis application section 92 of the band extender 9000.

The characteristic emphasis application section 92 receives the added synthesized signal MS from the adder 21 and receives the presence/absence-of-sound determination information VJ from the presence/absence-of-sound determination section 70, and outputs the band extended signal V.

The characteristic emphasis application section 92 may be disposed in an arbitrary position in a similar manner to the characteristic emphasis application section 32 described in the third embodiment, its position is not limited to a position at immediately downstream of the adder 21 as described in the ninth embodiment. For example, it may be disposed in a position at immediately downstream or immediately upstream of the sampling frequency converter 11. In the ninth embodiment, a case where it is disposed at immediately downstream of the adder 21 will be described.

Figure 15:
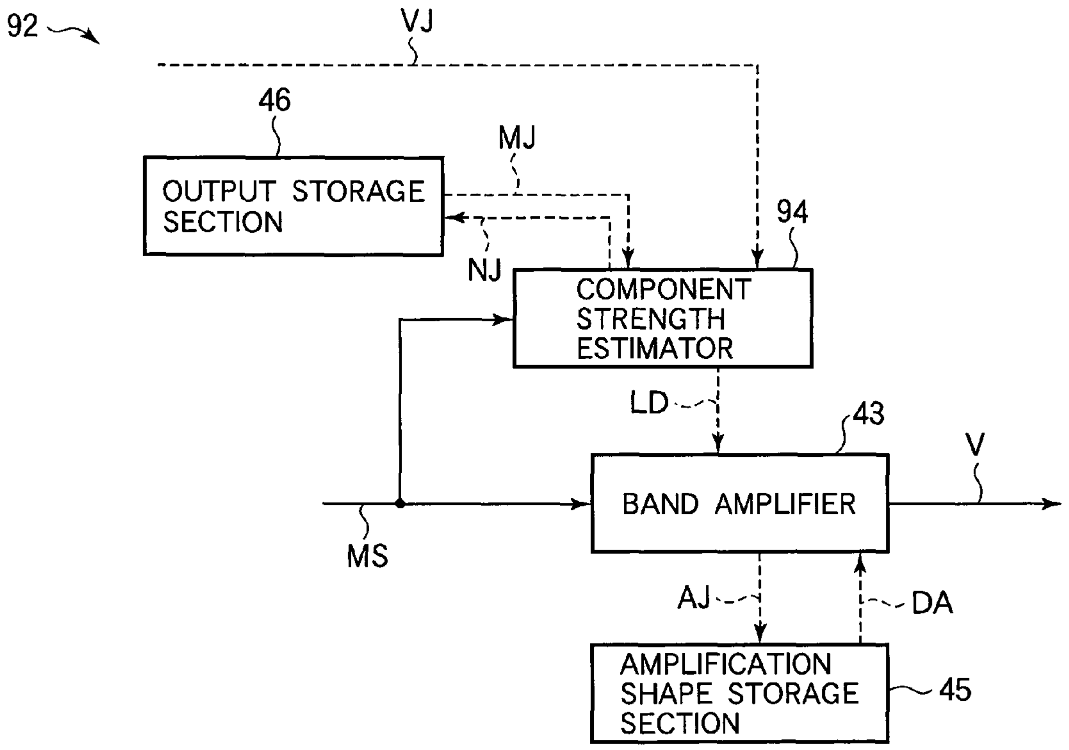
FIG. 15 is a functional block diagram showing an internal structure of a characteristic emphasis application section in the ninth embodiment.

FIG. 15 is a functional block diagram showing an internal structure of the characteristic emphasis application section 92 in the ninth embodiment.

As shown in FIG. 15, a characteristic emphasis application section 92 includes an output storage section 46, a component strength estimator 94, a band amplifier 43, and an amplification shape storage section 45.

The component strength estimator 94 receives an added synthesized signal MS, an output component information MJ, and the presence/absence-of-sound determination information VJ, outputs the component strength information NJ to an output storage section 46, and outputs the strength estimation information LD to the band amplifier 43.

The structure of the characteristic emphasis application section 92 in the ninth embodiment is not limited to the above-described structure, and may be, for example, a structure of the combination of the low range characteristic application section 72 and the switch 73 described in the seventh embodiment or a structure of the low range characteristic application section 82 described in the eighth embodiment.

<I-2> Operation in Ninth Embodiment

Next, a description will be made as to operation of the band extender 9000 of the ninth embodiment. Further, the description of the ninth embodiment will be made with emphasis on a difference as compared with the other embodiments.

The characteristic emphasis application section 92 receives the added synthesized signal MS from the adder 21 and the presence/absence-of-sound determination information VJ from the presence/absence-of-sound determination section 70.

When the presence/absence-of-sound determination information VJ indicates the presence of sound, the characteristic emphasis application section 92 performs the processing for applying the low range characteristic and outputs a result of the processing as the band extended signal V.

Although the position of the low range characteristic application section 92 is not limited to the position at immediately downstream of the adder described above, this position must be selected in such a way that the characteristic application section 92 can receive the signal for causing the low range characteristic to be input and the presence/absence-of-sound determination information VJ. The internal structure of the characteristic emphasis application section 92 can be arbitrarily designed as long as the low range characteristic component can be applied, and for example, the structure shown in FIG. 14 may be adopted for the processing to be performed.

Although in FIG. 15, the characteristic emphasis application section 92 operates in an approximately similar manner to the characteristic emphasis application section 42 of the fourth embodiment, there is a difference in a point of the operation of the component strength estimator 94.

The component strength estimator 94 receives the added synthesized signal MS, the presence/absence-of-sound determination information VJ, and the output component information MJ.

At this time, in a similar manner to the component strength estimator 44 of the fourth embodiment, when the presence/absence-of-sound determination information VJ indicates the presence of sound, the component strength estimator 94 determines whether the low band components includes a component to be emphasized or not on the basis of the added synthesized signal MS and the output component information MJ and estimates the amplification amount to output the strength estimation information LD.

On the other hand, the component strength estimator 94 determines that the low band component does not include effective component if the presence/absence-of-sound determination information VJ indicates the absence of sound, and outputs data indicating non-execution of the emphasis or the predetermined amplification amount as the strength estimation information LD to the band amplifier 43.

<I-3> Effects in Ninth Embodiment

As has been described above, in the ninth embodiment, since a result of the determination of the presence/absence of sound is utilized, it is possible to reduce the processing amount of the absence-of-sound portion and to avoid amplifying the ineffective portion. Furthermore, since the amplification of the absence-of-sound portion that is required to be amplified can be avoided, the sound quality of the output signal can be improved. Moreover, in terms of a result of the output, the function of adding the low band component is not impaired similarly, and this embodiment has the same advantage as that of the other embodiments. As a result of this, the sound quality of the output signal can be further improved.

《J》 Tenth Embodiment

Next, a band converted signal generator and a band extender according to the tenth embodiment of the present invention will be described with reference to the drawings.

<J-1> Structure in Tenth Embodiment

Figure 16:
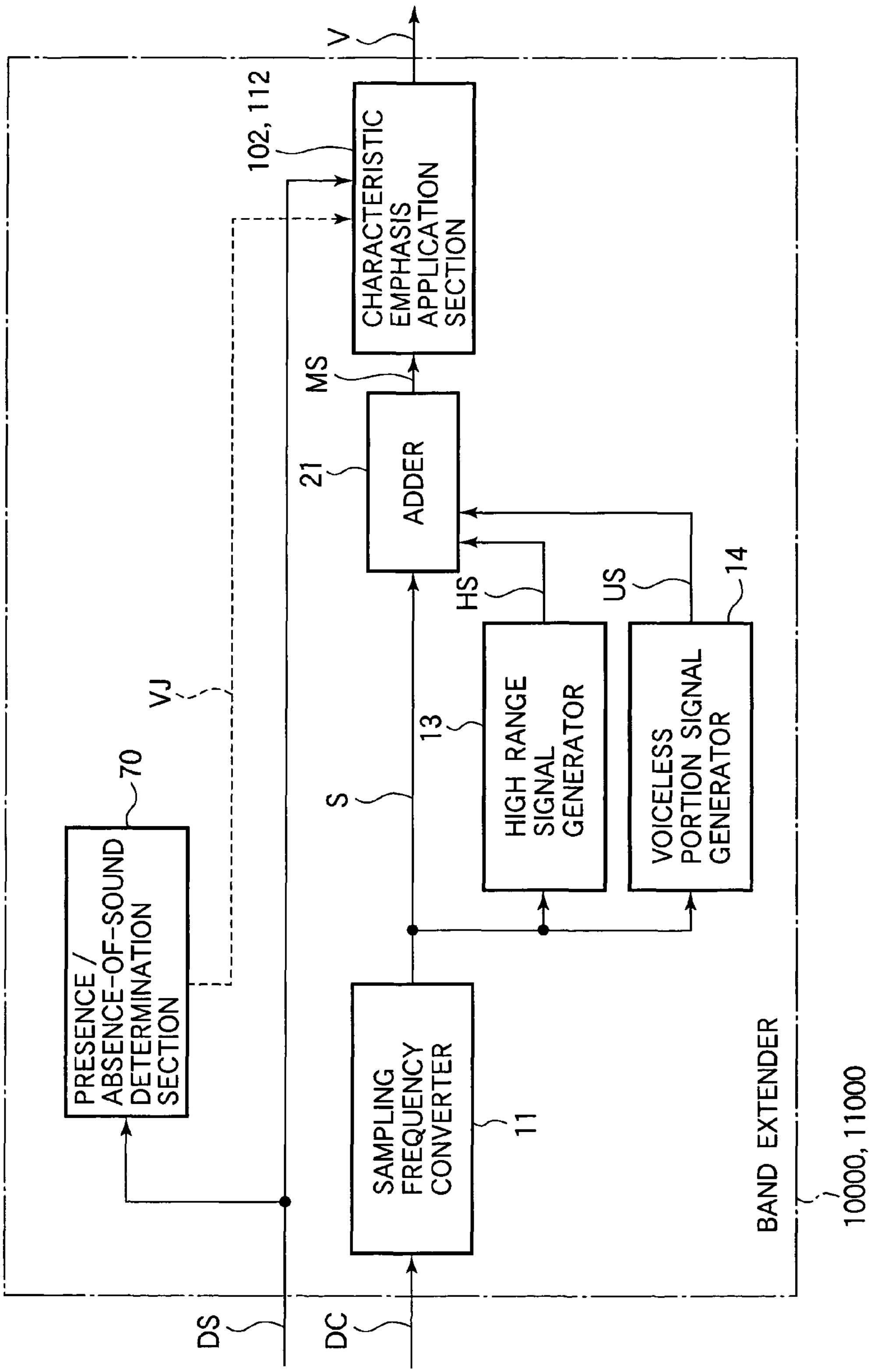
FIG. 16 is a functional block diagram showing an internal structure of a band extender according to the tenth and eleventh embodiments.

FIG. 16 is a functional block diagram showing a band extender 10000 of the tenth embodiment. Constituent elements in FIG. 16 that have the same function as those of the first to ninth embodiments are assigned the same reference numerals of characters shown in FIG. 1 to FIG. 15. Furthermore, the band extender 10000 of the tenth embodiment also performs each function every time one audio frame is input to it.

As shown in FIG. 16, the band extender 10000 of the tenth embodiment includes a sampling frequency converter 11, a high range signal generator 13, a voiceless portion signal generator 14, an adder 21, a presence/absence-of-sound determination section 70, and a characteristic emphasis application section 102.

The band extender 10000 of the tenth embodiment is different from those of the first to ninth embodiments in points of a function of the characteristic emphasis application section 102 and a function of the frequency estimator 106 as an internal structure of the characteristic emphasis application section 102.

The characteristic emphasis application section 102 receives the added synthesized signal MS and the component search signal DS, receives the presence/absence-of-sound determination information VJ from the presence/absence-of-sound determination section 70, and outputs the band extended signal V.

Figure 17:
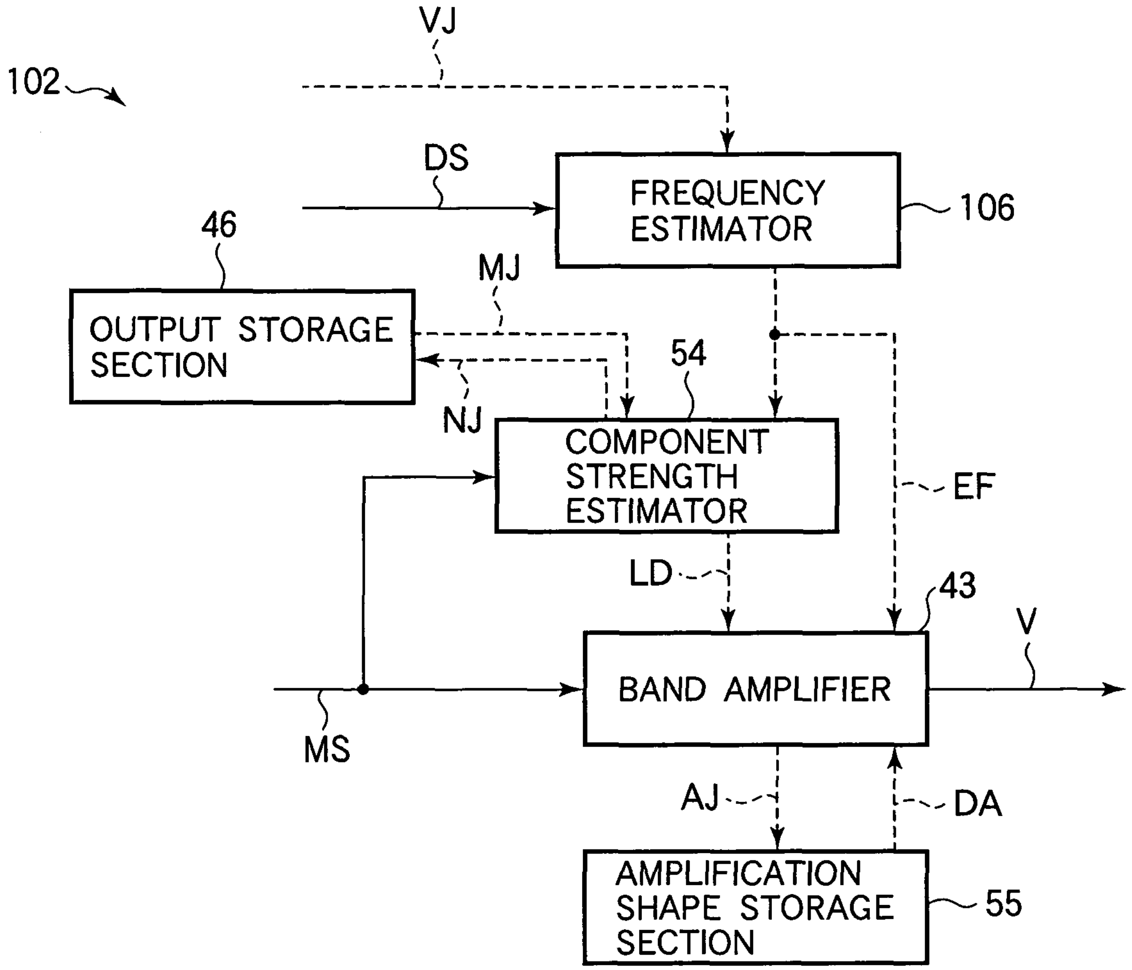
FIG. 17 is a functional block diagram showing an internal structure of a characteristic emphasis application section in the tenth embodiment.

FIG. 17 is a functional block diagram showing an internal structure of a characteristic emphasis application section 102. The characteristic emphasis application section 102 includes an output storage section 46, a frequency estimator 106, a component strength estimator 54, a band amplifier 43, and an amplification shape storage section 55.

The frequency estimator 106 receives an added synthesized signal MS and the presence/absence-of-sound determination signal VJ, and outputs the signal period information EF to the component strength estimator 54 and the band amplifier 43.

<J-2> Operation in Tenth Embodiment

Next, a description will be made as to operation of the characteristic emphasis application section 102 of the band extender 10000 of the tenth embodiment with emphasis on a difference as compared with the first to ninth embodiments.

The added synthesized signal MS, the component search signal DS, and the presence/absence-of-sound determination signal VJ are input to the characteristic emphasis application section 102.

The characteristic emphasis application section 102 performs the processing for the application of the low range characteristic in a similar manner to the internal processing of the characteristic emphasis application section 102 described in the fifth embodiment when the presence/absence-of-sound determination information VJ indicates the presence of sound, and outputs a result of the processing as the band extended signal V.

On the other hand, the characteristic emphasis application section 102 determines that the input added synthesized signal MS does not have enough low range characteristic to apply it when the presence/absence-of-sound determination information VJ indicates the absence of sound, and does not apply the low range characteristic component.

Next, the internal operation of the characteristic application section 102 will be described. The tenth embodiment is different from the first to ninth embodiments in a point of the operation of the frequency estimator 106.

The frequency estimator 106 receives the component search signal DS and the presence/absence-of-sound determination signal VJ.

At this time, the frequency estimator 106 estimates a fundamental frequency in a similar manner to the fifth embodiment when the presence/absence-of-sound determination signal VJ indicates the presence of sound, and outputs a result of the processing as the signal period information EF to the component strength estimator 54 and the band amplifier 43.

Furthermore, the frequency estimator 106 determines that component to be emphasized is not includes when the presence/absence-of-sound determination signal VJ indicates the absence of sound, and outputs information indicating ineffectiveness of the emphasis as the signal period information EF to the component strength estimator 54 and the band amplifier 43.

The information indicating ineffectiveness of the emphasis is, for example, information that a fundamental frequency is set to a value of zero or a value larger than 300 Hz. At this time, the component strength estimator 54 determines that it is an amplification non-executable state when receiving the signal period information EF of this value. Further, a method of outputting the ineffective information is not limited to this method, and may be a method of just outputting a flag indicating ineffectiveness.

(J-3) Effects of the Tenth Embodiment

As has been described above, in the tenth embodiment, since the absence-of-sound component to be not amplified is not amplified, it is possible to avoid producing an unusual sound that often takes place when the absence-of-sound component is band extended.

Furthermore, in the tenth embodiment, the function of causing the user to hear the sound with a spacious feeling is not impaired because of appropriate amplification suitable for the input signal when selecting the amplification amount and the frequency, and this embodiment has the same advantage as that of the first to ninth embodiments. As a result of this, the sound quality of the output signal can be further improved.

《K》 Eleventh Embodiment

Next, a band converted signal generator and a band extender according to the eleventh embodiment of the present invention will be described with reference to the drawings.

<K-1> Structure in Eleventh Embodiment

Since a structure of a band extender 11000 of the eleventh embodiment is the same as or corresponds to that of the tenth embodiment shown in FIG. 16, the band extender 11000 will be described with reference to FIG. 16.

The eleventh embodiment is different from the tenth embodiment in points of a function of the characteristic emphasis application section 112, a function of the frequency estimator 116, and the internal structure. The following description will be made with emphasis on the functions that are different from those of the first to tenth embodiments.

Figure 18:
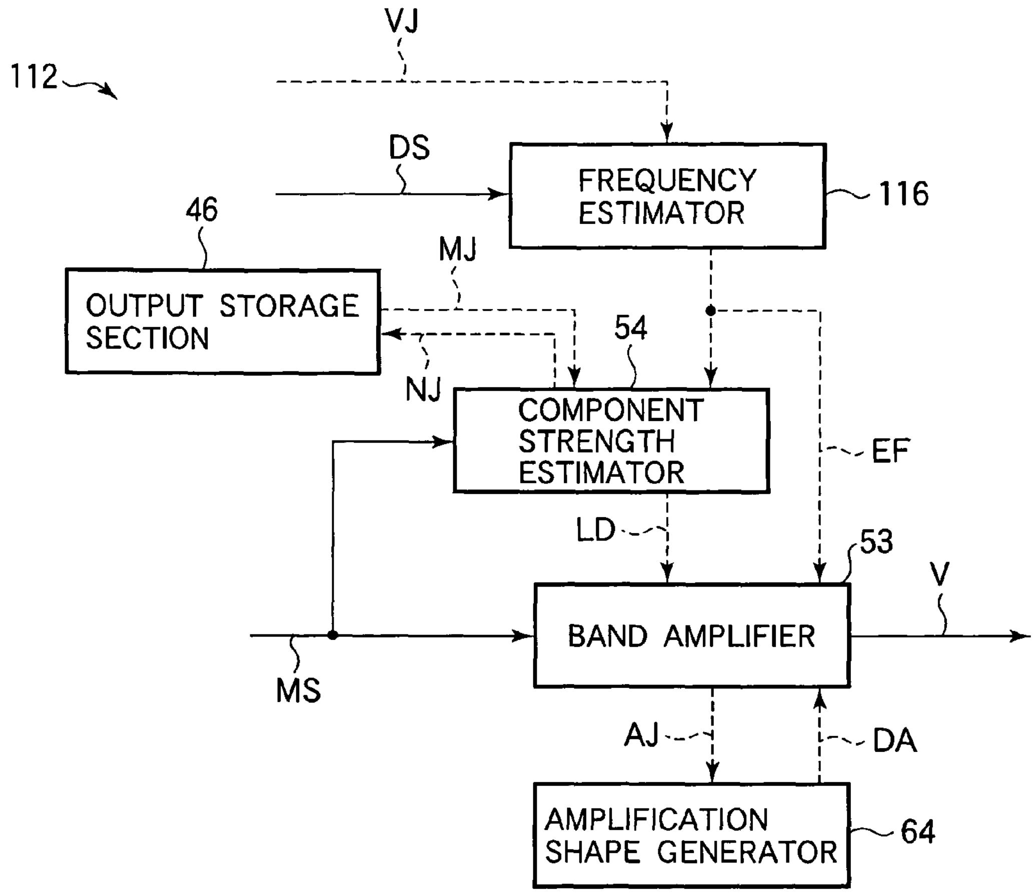
FIG. 18 is a functional block diagram showing an internal structure of a characteristic emphasis application section in the eleventh embodiment.
Figure 19:
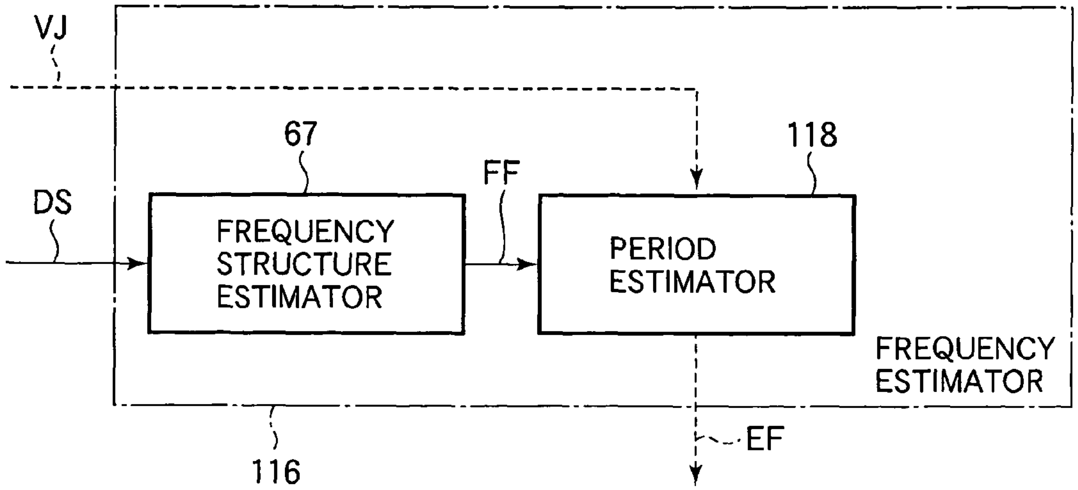
FIG. 19 is a functional block diagram showing an internal structure of a frequency estimator in the eleventh embodiment.

FIG. 18 is a functional block diagram showing a structure of a characteristic emphasis application section 112 in the eleventh embodiment. Furthermore, FIG. 19 is a functional block diagram showing an internal structure of a frequency estimator 116.

A period estimator 118 provided in the frequency estimator 116 receives the frequency structure series FF from a frequency structure estimator 67 and the presence/absence-of-sound determination information VJ, and outputs the signal period information EF.

<K-2> Operation in Eleventh Embodiment

Next, operation of the characteristic emphasis application section 112 of the band extender 11000 of the eleventh embodiment will be described with emphasis on operation that is different from that of the first to tenth embodiments.

Although the operation of the eleventh embodiment is approximately the same as that of the sixth embodiment, the operation of the period estimator 118 provided in the frequency estimator 112 is different from that of the first to tenth embodiments.

The frequency structure series FF is input to the period estimator 118 from the frequency structure estimator 67, and the presence/absence-of-sound determination signal VJ is also input to the period estimator 118 from the presence/absence-of-sound determination section 70.

When the presence/absence-of-sound determination signal VJ indicates the presence of sound in a similar manner to the frequency structure estimator 67 of the sixth embodiment, the fundamental frequency of the signal period information EF is estimated from the frequency structure series FF in a similar manner to the period estimator 58 of the sixth embodiment.

On the other hand, when the presence/absence-of-sound determination signal VJ indicates the absence of sound, information indicating that the low band component is ineffective (e.g., the fundamental frequency is a value of zero) or the predetermined fundamental frequency (e.g., 180 Hz) is output as the signal period information EF.

Although in the eleventh embodiment, the period estimator 118 receives the presence/absence-of-sound determination information VJ and performs the processing for each of the presence of sound and the absence of sound, the frequency structure estimator may receive it and perform this processing.

When the signal period information EF is caused to be output as a value of zero and it is received by the component strength estimator 54, it is determined to be an emphasis non-executable state.

<K-3> Effects in Eleventh Embodiment

As has been described above, in the eleventh embodiment, since amplification can be performed at the appropriate time for amplification by adopting a result of the determination of the presence/absence of sound, it is possible to hear the sound with a spacious feeling in the low range portion.

Furthermore, in the eleventh embodiment, in terms of a result of the output, the function of adding the low band component is not impaired similarly and this embodiment has the same advantage as that of the first to ninth embodiments. As a result of this, the sound quality of the output signal can be further improved.

《L》 Twelfth Embodiment

Next, a band converted signal generator and a band extender according to the twelfth embodiment of the present invention will be described with reference to the drawings.

<L-1> Structure in Twelfth Embodiment

Since the structure of the twelfth embodiment のband extender 12000 is the same as or corresponds to the structure shown in FIG. 4, the description will be made with reference to FIG. 4.

Figure 20:
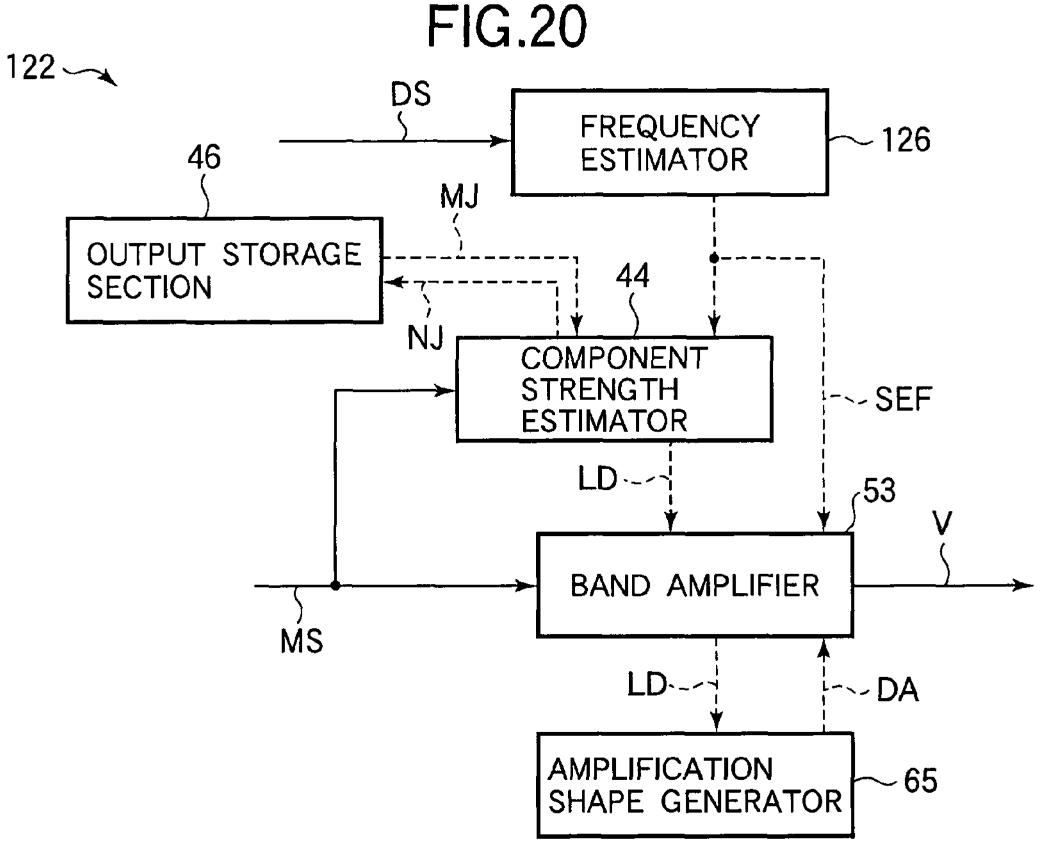
FIG. 20 is a functional block diagram showing an internal structure of a characteristic emphasis application section in the twelfth embodiment.

FIG. 20 is a functional block diagram showing an internal structure of a characteristic emphasis application section 122 in the twelfth embodiment.

Figure 21:
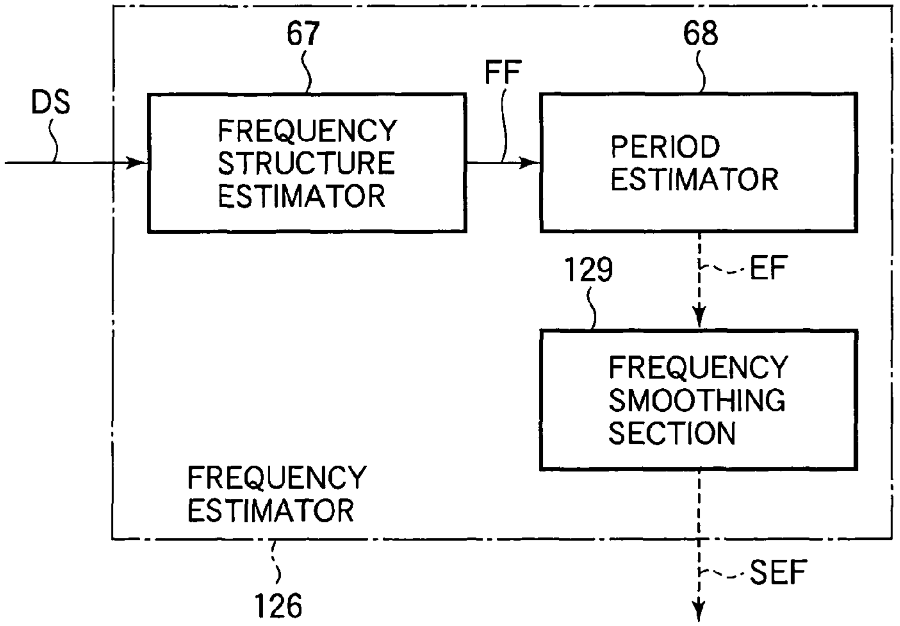
FIG. 21 is a functional block diagram showing an internal structure of a frequency estimator in the twelfth embodiment.

FIG. 21 is a functional block diagram showing a structure of a frequency estimator 126 provided in the characteristic emphasis application section 122.

Constituent elements in these figures that have substantially the same function of those of the first to eleventh embodiments are assigned the same reference numerals as those shown in FIG. 1 to FIG. 19. Further, a description will be made as to a case where each functional means operates every time one audio frame is input in the band extender 12000 of the twelfth embodiment.

Next, a description will be made as to the structure of the characteristic emphasis application section 122 of the band extender 12000 of the twelfth embodiment with emphasis on a difference as compared with the first to eleventh embodiments.

The twelfth embodiment is different from the first to eleventh embodiments in points of the structure of the frequency estimator 126 of the characteristic emphasis application section 122 and the addition of the frequency smoothing section 129 inside the frequency estimator 126.

Although in the twelfth embodiment, a description is made as to a case where the amplification shape generator 65 is disposed inside the characteristic emphasis application section 122, this amplification shape generator 65 may be the same one as the amplification shape storage section 55 of the fifth embodiment.

The frequency estimator 126 receives the component search signal DS, and outputs the smoothing signal period information SEF to the band amplifier 53.

Next, the internal structure of the frequency estimator 126 will be described. The frequency estimator 126 includes a frequency structure estimator 67, a period estimator 68, and a frequency smoothing section 129.

The frequency smoothing section 129 receives the signal period information EF, and outputs the smoothing signal period information SEF to the band amplifier 53.

<L-2> Operation in Twelfth Embodiment

Next, a description will be made as to operation of the characteristic emphasis application section 122 of the band extender 12000 of the twelfth embodiment with emphasis on a difference as compared with the first to eleventh embodiments.

The twelfth embodiment is different from the other embodiments in a point of processing of the frequency smoothing section 129 disposed inside the frequency estimator 126. The processing of the frequency smoothing section 129 will be described.

The frequency smoothing section 129 receives the signal period information EF from the period estimator 68. The frequency smoothing section 129 extracts a fundamental frequency estimated by the period estimator 68 from the signal period information EF and performs the smoothing processing of the extracted fundamental frequency.

The smoothing processing in the twelfth embodiment is performed in order to improve continuity of the fundamental frequency output for each one audio frame. In the twelfth embodiment, the fundamental frequency is changed for each sample existing in the current frame.

For example, a fundamental frequency of the current audio frame is represented by fb and a fundamental frequency of the n-th sample is represented by f(n). At this time, the following equation holds.

$$f(n)=\alpha\cdot f(n-1)+\beta\cdot fb$$

f(0) is a smoothed fundamental frequency at the last sample of the immediately previous frame. Further, the equations $$\alpha=0.9 \text{ and } \beta=0.1$$

are adopted, other values may be adopted.

Furthermore, although in the twelfth embodiment, the smoothed fundamental frequency is output for each sample, the smoothed fundamental frequency may be output at the interval of, for example, an arbitrary period such as ¼ frame or a variable interval. Further, the smoothing processing is not limited to the above-mentioned processing, and it may be, for example, a method for changing linearly a frequency.

<L-3> Effects in Twelfth Embodiment

As has been described above, in the twelfth embodiment, since the smoothing processing for the fundamental frequency is performed to reduce an instantaneous change of the fundamental frequency, sudden occurrence of the unusual sound can be suppressed. Furthermore, in terms of a result of the output, the function of adding the low band component is not impaired similarly, and this embodiment has the same advantage as that of the first to eleventh embodiments. As a result of this, the sound quality of the output signal can be further improved.

《M》 Thirteenth Embodiment

Next, a band converted signal generator and a band extender according to the thirteenth embodiment of the present invention will be described with reference to the drawings.

<M-1> Structure in Thirteenth Embodiment

Since the structure of the band extender 12200 of the thirteenth embodiment is the same as or corresponds to that shown in FIG. 4, the band extender 12200 will be described with reference to FIG. 4. Furthermore, the structure of the characteristic emphasis application section 142 of the thirteenth embodiment is the same as or corresponds to that shown in FIG. 8, the characteristic emphasis application section 142 will be described with reference to FIG. 8.

Further, constitutional elements that have the same or similar functions as those of the first to twelfth embodiments are assigned the same reference numerals or characters as those shown in FIG. 1 to FIG. 21. Furthermore, a description will be made as to a case where each functional means of the band extender 12200 of the thirteenth embodiment operates every time one audio frame is input to it.

The thirteenth embodiment is different from the other embodiments in a point of the operation of the amplification shape generator 145 of the band extender 12200.

Figure 22:
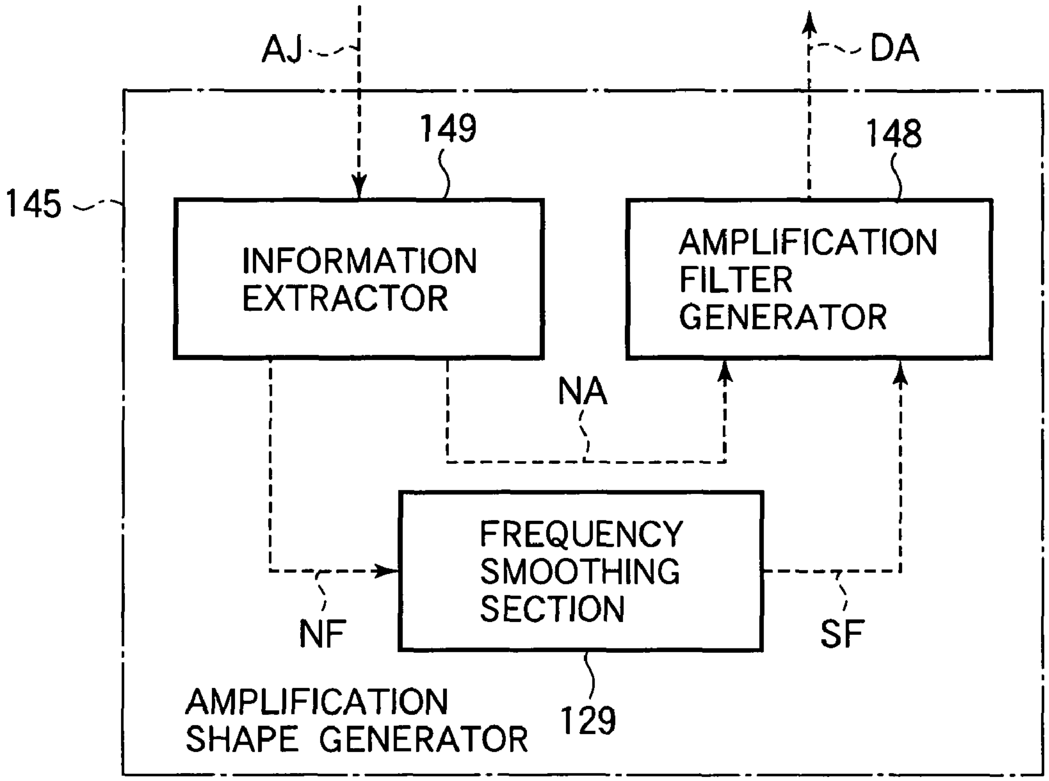
FIG. 22 is a functional block diagram showing an internal structure of an amplification shape generator in the thirteenth embodiment.

FIG. 22 is a functional block diagram showing an internal structure of an amplification shape generator 145 in the thirteenth embodiment.

As shown in FIG. 22, the characteristic emphasis application section 142 of the thirteenth embodiment includes an information extractor 149, a frequency smoothing section 129, and an amplification filter generator 148.

In the thirteenth embodiment, a case where the invention is applied to the amplification shape generator 145 will be described, but it can be applied to the amplification shape storage section 55 in the fifth and ninth embodiments. In the thirteenth embodiment, a description will be made as to the amplification shape generator 145 which is formed by the amplification shape generator 65 of the sixth embodiment and a frequency smoothing section 129 incorporated in it.

The frequency smoothing section 129 is newly added to the amplification shape generator 145.

The frequency smoothing section 129 is a functional means that is the same as the frequency smoothing section described in the twelfth embodiment, but it receives the amplification frequency NF and outputs the smoothed amplification frequency SF in the thirteenth embodiment.

<M-2> Operation in Thirteenth Embodiment

Next, a description will be made as to operation of the characteristic emphasis application section 142 of the band extender 12200 of the thirteenth embodiment with emphasis on a difference as compared with the first to twelfth embodiments.

The amplification frequency NF extracted by the information extractor 149 is input to the frequency smoothing section 129.

The frequency smoothing section 129 performs the above-mentioned the same or similar smoothing processing to the input amplification frequency NF in the same or similar manner to the twelfth embodiment to output a result of the processing to the amplification filter generator 148.

The smoothing processing of the frequency is processing for generating a smoothed amplification frequency SF by changing the amplification frequency for each sample. Therefore, the smoothed amplification frequency SF is sent to the amplification filter generator 148 per each sample. Further, an interval between each smoothing processing is not limited to an interval of samples, it may be an interval of ¼ audio frame or a variable interval.

The amplification filter generator 148 generates the amplification filter every time the smoothed amplification frequency SF is input to it, and outputs the amplitude shape information DA. Therefore, in the thirteenth embodiment, the amplification shape information DA is output once every sample interval.

<M-3> Effects in Thirteenth Embodiment

As has been described above, in the thirteenth embodiment, since the amplification frequency is subject to the smoothing processing, it is possible to give continuity of the characteristic of the amplification filter and to perform the characteristic application more naturally. Furthermore, in this embodiment, the functions of suppressing the sudden change of the fundamental frequency and adding the low band component to the result of the output are not impaired similarly, and this embodiment has the same advantage as that of the first to twelfth embodiments. As a result of this, the sound quality of the output signal can be further improved.

《N》 Fourteenth Embodiment

Next, a band converted signal generator and a band extender according to the fourteenth embodiment of the present invention will be described with reference to the drawings.

<N-1> Structure in Fourteenth Embodiment

Figure 23:
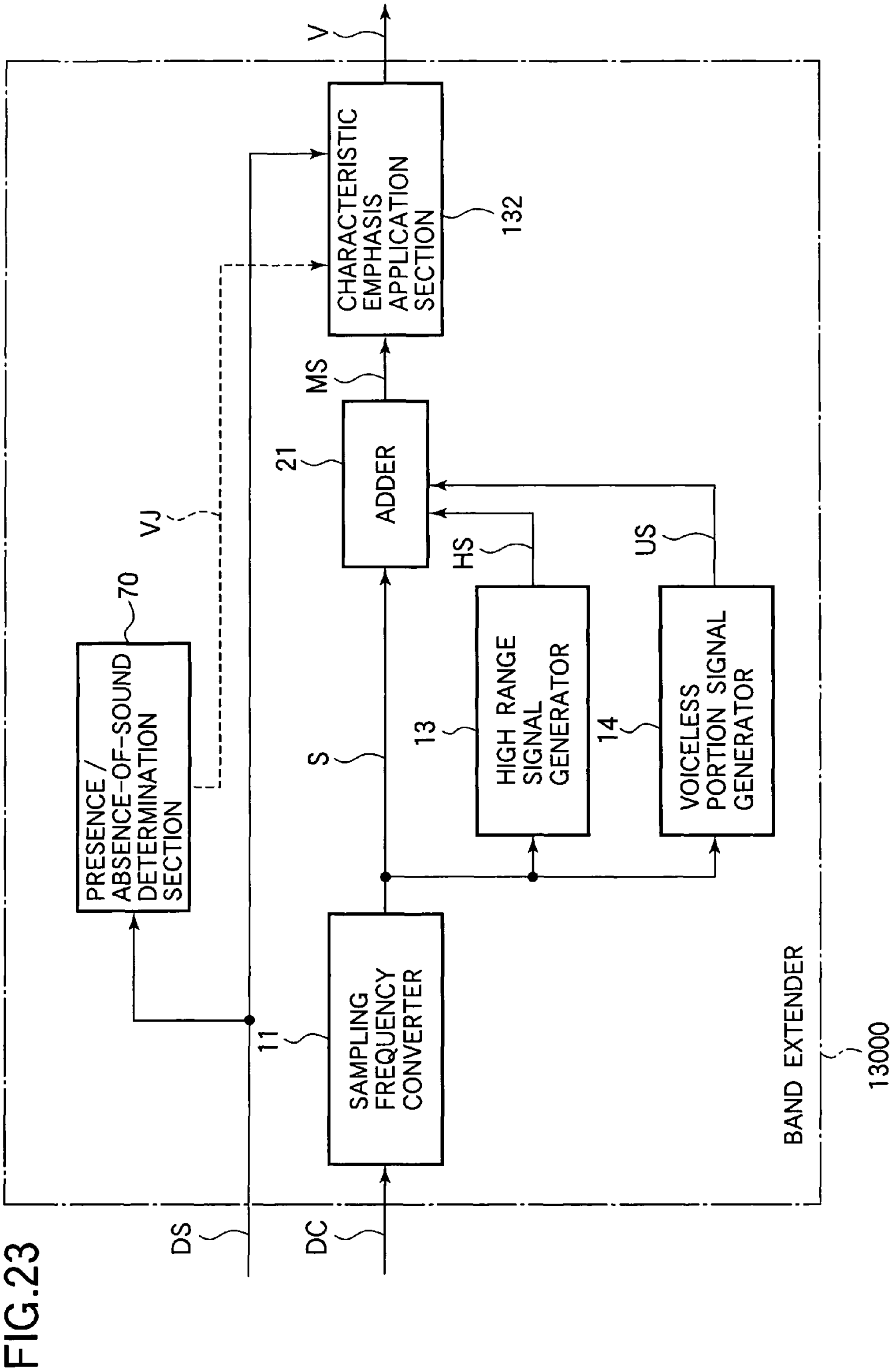
FIG. 23 is a functional block diagram showing an internal structure of a band extender according to the fourteenth embodiment.

FIG. 23 is a functional block diagram showing a structure of a band extender 13000 of the fourteenth embodiment. As shown in FIG. 23, the band extender 13000 of the fourteenth embodiment includes a sampling frequency converter 11, a high range signal generator 13, a voiceless portion signal generator 14, an adder 21, a presence/absence-of-sound determination section 70, and a characteristic emphasis application section 132.

Figure 24:
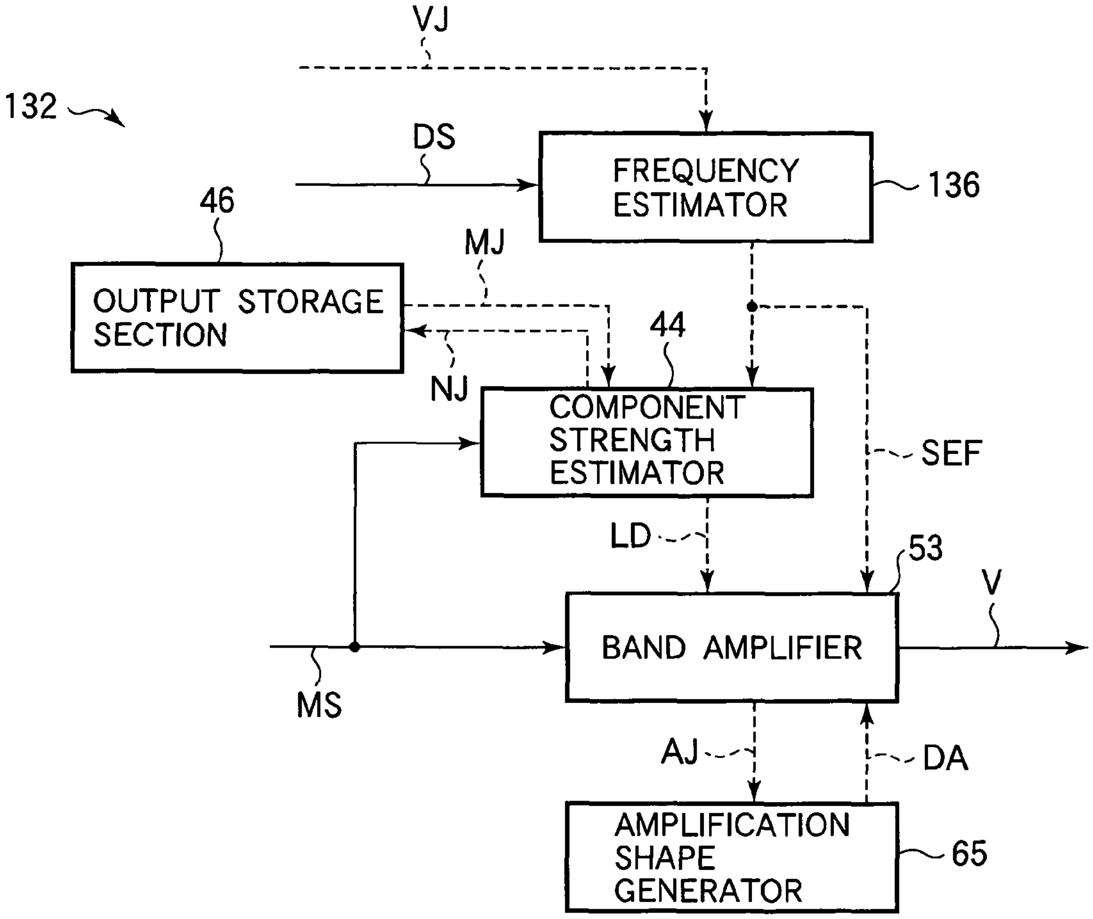
FIG. 24 is a functional block diagram showing an internal structure of a characteristic emphasis application section in the fourteenth embodiment.

Further, FIG. 24 is a functional block diagram showing a characteristic emphasis application section 132 in the fourteenth embodiment. As shown in FIG. 24, the characteristic emphasis application section 132 in the fourteenth embodiment includes an output storage section 46, a component strength estimator 44, a band amplifier 53, an amplification shape generator 65, and a frequency estimator 136.

Figure 25:
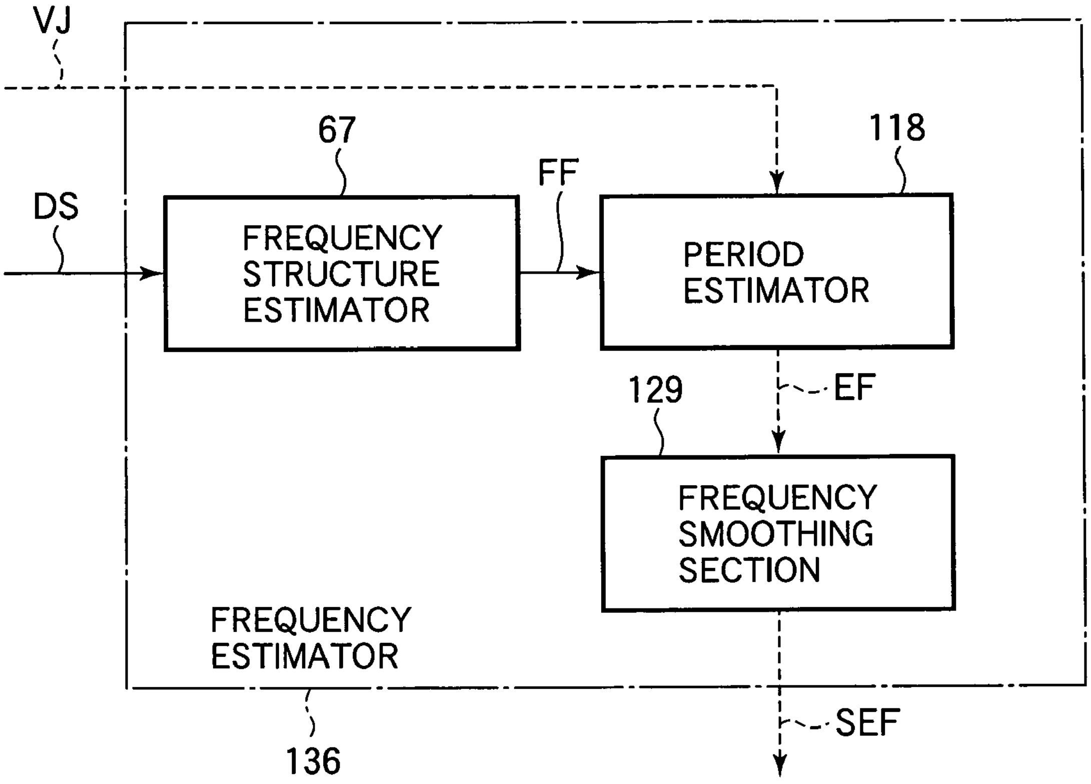
FIG. 25 is a functional block diagram showing an internal structure of a frequency estimator in the fourteenth embodiment.

Furthermore, FIG. 25 is a functional block diagram showing an internal structure of a frequency estimator 136 in the fourteenth embodiment. As shown in FIG. 25, the frequency estimator 136 in the fourteenth embodiment includes a frequency structure estimator 67, a frequency smoothing section 129, and a period estimator 118.

Constitutional elements in FIG. 23 to FIG. 25 that have the same or similar function to those described in the first to thirteenth embodiments are assigned the same reference numerals or characters shown in FIG. 1 to FIG. 22. Furthermore, a description will be made as to a case where each functional means of the band extender 13000 of the fourteenth embodiment operates every time one audio frame is input to it.

Further, in the fourteenth embodiment, a description will be made as to a case where the frequency smoothing section 129 is provided within the frequency estimator 116 in the similar manner to the twelfth embodiment, but it may be provided within the amplification shape generator 65 in the similar manner to the thirteenth embodiment or may be provided within both of them.

<N-2> Operation in Fourteenth Embodiment

Next, a description will be made as to a case where the characteristic emphasis application section 132 of the band extender 13000 of the fourteenth embodiment with emphasis on a difference as compared with the first to thirteenth embodiments.

The fourteenth embodiment is different from the other embodiments in a point of operation of the frequency estimator 136 of the characteristic emphasis application section 132.

As has been described in the eleventh embodiment, the signal period information EF as information of the fundamental frequency is generated by the frequency structure estimator 67 and the period estimator 118 in consideration of the presence/absence of sound in the fourteenth embodiment.

The frequency smoothing section 129 performs the smoothing processing of the frequency of the fundamental frequency information, thereby generating information of a smoothed fundamental frequency.

At this time, if the information indicating an invalid frequency of soundless period is output from the period estimator 118, the smoothing is performed on the assumption that the output frequency is regarded as the same frequency as the immediately previous fundamental frequency, for example. Further, the processing at the soundless period is not limited to such processing, but it may be processing for causing the frequency to approach the predetermined frequency which has been set in advance.

<N-3> Effects in Fourteenth Embodiment

As has been described above, in the fourteenth embodiment, since both the smoothing processing and the presence/absence-of-sound determination are applied to the fundamental frequency, it is possible to suppress the sudden change of the fundamental frequency and to reduce a noise and/or an unusual sound by emphasizing the absence-of-sound component.

Furthermore, in the fourteenth embodiment, in terms of a result of the output, the function of adding the low band component is not impaired similarly, and this embodiment has the same advantage as that of the first to thirteenth embodiments. As a result of this, the sound quality of the output signal can be further improved.

《O》 Other Embodiments

In the first to fourteenth embodiments, the characteristic emphasis application section described in the third to sixth embodiments and the ninth to fourteenth embodiments may be constructed by the component extractor, the signal component determination section, the switch, the characteristic non-application section, and the characteristic emphasis application section, which have been described in the second embodiment.

In the first to fourteenth embodiments, although the description has been made as to the case where the method of extending the band is performed by generating two synthesized signals of the synthesized high range signal HS and the synthesized voiceless signal US, the synthesized signals having other bands that are generated to be added is not limited to two signals, and number of the synthesized signals may be either larger than two or smaller than two.

In the first to fourteenth embodiments, a case where the low range characteristic is applied has been described, but an arbitrary frequency band may be selected as the characteristic to be applied. Further, in the first to fourteenth embodiments, the cases where the frequency component below the telephone band is generated as a result of processing have been described, but a result of the processing may have a component above the telephone band or a component within a scope of the telephone band.

The cases where the signal in the present invention is a voice signal have been described, but the present invention can be applied to other periodic signals, for example, a video signal or the like.

In the first to fourteenth embodiments, the cases where each constitutional element is hardware have been described, but functions of each constitutional element may be implemented by the software. Furthermore, in the description of the first to fourteenth embodiments, the cases where the present invention is applied to the general public network, but the present invention may be applied to networks other than the public network.

What is claimed is:

1. A band converted signal generator for converting a first signal, the first signal including components of a limited frequency band and components of a frequency band outside the limited frequency band, to a second signal, the band converted signal generator comprising:

a component emphasis means emphasizing only one or more specific frequency components of the first signal to generate the second signal, the specific frequency components being selected from among the components of the frequency band outside the limited frequency band, wherein the component emphasis means includes, an emphasis propriety determination section extracting each of the specific frequency components and determining whether the emphasizing is proper or not, that is, whether each of the extracted specific frequency components is a frequency component that needs to be emphasized or another frequency component that does not need to be emphasized; and an emphasis execution section emphasizing each of the specific frequency components when the emphasis propriety determination section determines that the emphasizing is proper, the emphasis execution section invalidating each of the specific frequency components when the emphasis propriety determination section determines that the emphasizing is not proper.

2. A band converted signal generator for converting a first signal, the first signal including components of a limited frequency band and components of a frequency band outside the limited frequency band, to a second signal, the band converted signal generator comprising:

a component emphasis means emphasizing only one or more specific frequency components of the first signal to generate the second signal, the specific frequency components being selected from among the components of the frequency band outside the limited frequency band, wherein the component emphasis means includes, a component strength estimator estimating a component strength of each of the specific frequency components; and a band gain section assigning a gain to each of the specific frequency components, the gain being produced in accordance with gain information corresponding to strength estimation information supplied from the component strength estimator when the component strength estimator determines that the emphasizing of each of the specific frequency components is executable on the basis of the strength estimation information.

3. The band converted signal generator according to claim 2, wherein:

the component emphasis means includes a frequency estimator estimating a fundamental frequency component of received signal;

the component emphasis estimator estimates the component strength of the frequency component estimated by the frequency estimator;

the band gain section also assigns a predetermined gain to each of the frequency components estimated by the frequency estimator.

4. The band converted signal generator according to claim 3, wherein the frequency estimator estimates a frequency structure of a signal to be estimated and estimates the fundamental frequency component on the basis of the estimated frequency structure.

5. A band converted signal generator for converting a first signal, the first signal including components of a limited frequency band and components of a frequency band outside the limited frequency band, to a second signal, the band converted signal generator comprising:

a component emphasis means emphasizing only one or more specific frequency components of the first signal to generate the second signal, the specific frequency components being selected from among the components of the frequency band outside the limited frequency band, wherein the component emphasis means includes a frequency smoothing section causing an estimated fundamental frequency to have a continuous transition in a time region.

6. A band extender for extending an input signal to generate a second signal, the input signal including components of a limited frequency band and components of a frequency band outside the limited frequency band, the band extender comprising:

a high range signal generator generating a first extended signal including components extended to a higher frequency side from the input signal;

an adder adding the input signal and the first extended signal to generate a first signal; and a band converted signal generator converting the first signal to the second signal, wherein the band converted signal generator includes a component emphasis means emphasizing only one or more specific frequency components of the first signal to generate the second signal, the specific frequency components being selected from among the components of the frequency band outside the limited frequency band.

7. The band extender according to claim 6, further comprising:

a voiceless portion signal generator generating a second extended signal including an voiceless portion extended from the input signal;

wherein the adder adds the input signal, the first extended signal, and the second extended signal to generate the first signal.

8. A band extender for extending a first signal to generate an output signal, the first signal including components of a limited frequency band and components of a frequency band outside the limited frequency band, the band extender comprising:

a band converted signal generator converting the first signal to a second signal; and an adder adding the first signal and the second signal to generate the output signal, wherein the band converted signal generator includes a component emphasis means emphasizing only one or more specific frequency components of the first signal to generate the second signal, the specific frequency components being selected from among the components of the frequency band outside the limited frequency band.

9. The band extender according to claim 8, further comprising:

a high range signal generator generating a first extended signal including components extended to a higher frequency side from the input signal;

wherein the adder adds the first signal, the second signal, and the first extended signal to generate the output signal.

10. The band extender according to claim 8, further comprising:

a voiceless portion signal generator generating a second extended signal including an voiceless portion extended from the input signal;

wherein the adder adds the first signal, the second signal, and the second extended signal to generate the output signal.

11. A band converted signal generator for converting a signal, a certain frequency band of which is suppressed, to another signal having a component of the certain frequency band which is suppressed, the band converted signal generator comprising:

a component emphasis means emphasizing only one or more specific frequency components selected from among frequency components of an input signal; and a component extraction means extracting a signal component of a desired frequency band from an output signal supplied from the component emphasis means, wherein the input signal input to the component emphasis means includes at least two signals.

12. A band extender comprising:

a band converted signal generator for converting a signal, a certain frequency band of which is suppressed, to another signal having a component of the certain frequency band which is suppressed, the band converted signal generator including:

a component emphasis means emphasizing only one or more specific frequency components selected from among frequency components of an input signal; and a component extraction means extracting a signal component of a desired frequency band from an output signal supplied from the component emphasis means, converting a signal, a certain frequency band of which is suppressed, to another signal having a component of the certain frequency band which is suppressed; and an adder adding the signal, the certain frequency band of which is suppressed, as an input signal, and a signal including at least one component generated within the certain frequency band which is suppressed, wherein the band converted signal generator receives a signal output from the adder and outputs a converted signal.

* * * * *